United States Patent
Ikeda

(10) Patent No.: US 7,772,913 B2
(45) Date of Patent: Aug. 10, 2010

(54) MIXER CIRCUIT, COMMUNICATION DEVICE, AND ELECTRONIC EQUIPMENT

(75) Inventor: Masayuki Ikeda, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/424,926

(22) Filed: Apr. 16, 2009

(65) Prior Publication Data

US 2009/0261886 A1 Oct. 22, 2009

(30) Foreign Application Priority Data

Apr. 21, 2008 (JP) ............................. 2008-109881
Mar. 9, 2009 (JP) ............................. 2009-055231

(51) Int. Cl.
*G06G 7/12* (2006.01)

(52) U.S. Cl. .................... 327/355; 327/359; 45/333; 45/323

(58) Field of Classification Search ......... 327/355–361; 455/326, 333, 323
See application file for complete search history.

(56) References Cited

U.S. PATENT DOCUMENTS

| | | | |
|---|---|---|---|
| 6,421,389 B1 | 7/2002 | Jett et al. | |
| 6,429,721 B1 * | 8/2002 | Armitage et al. | ............. 327/359 |
| 6,512,408 B2 * | 1/2003 | Lee et al. | ..................... 327/359 |
| 7,512,393 B2 * | 3/2009 | Pullela et al. | ............... 455/323 |
| 2001/0033576 A1 | 10/2001 | Richards | |
| 2003/0108133 A1 | 6/2003 | Richards | |

FOREIGN PATENT DOCUMENTS

| | | |
|---|---|---|
| JP | A-8-288882 | 11/1996 |
| JP | A-10-126300 | 5/1998 |
| JP | A-2004-165612 | 6/2004 |
| JP | A-2006-211582 | 8/2006 |
| JP | A-2006-279599 | 10/2006 |

OTHER PUBLICATIONS

E. Barajas et al., "Low Noise Amplifiers for Low-Power Impulse Radio Ultra-Wideband Receivers," Proceedings IEEE ICUWB, 2006, pp. 1-5.
T. Terada et al., "A CMOS Impulse Radio Ultra-Wideband Transceiver for 1Mb/s Data Communications and ±2.5cm Range Findings," Symposium on VLSI Circuits Digest of Technical Papers, 2005, pp. 30-33.
E. Barajas et al., "A Low-Power Template Generator for Coherent Impulse-Radio Ultra Wide-Band Receivers," Proceedings IEEE ICUWB, 2006, pp. 97-102.

* cited by examiner

*Primary Examiner*—Dinh T. Le
(74) *Attorney, Agent, or Firm*—Oliff & Berridge, PLC

(57) ABSTRACT

A mixer circuit includes a grounded-gate amplifier disposed between an input node and a first node, and first through nth (n denotes an integer equal to or greater than 1) series transistor rows disposed between the first node and a second node, each of the first through nth series transistor rows includes two or more transistors coupled in series between the first node and the second node, and the transistors constituting the first through nth series transistor rows are controlled by first through mth (m denotes an integer equal to or greater than 2) control signals.

15 Claims, 16 Drawing Sheets

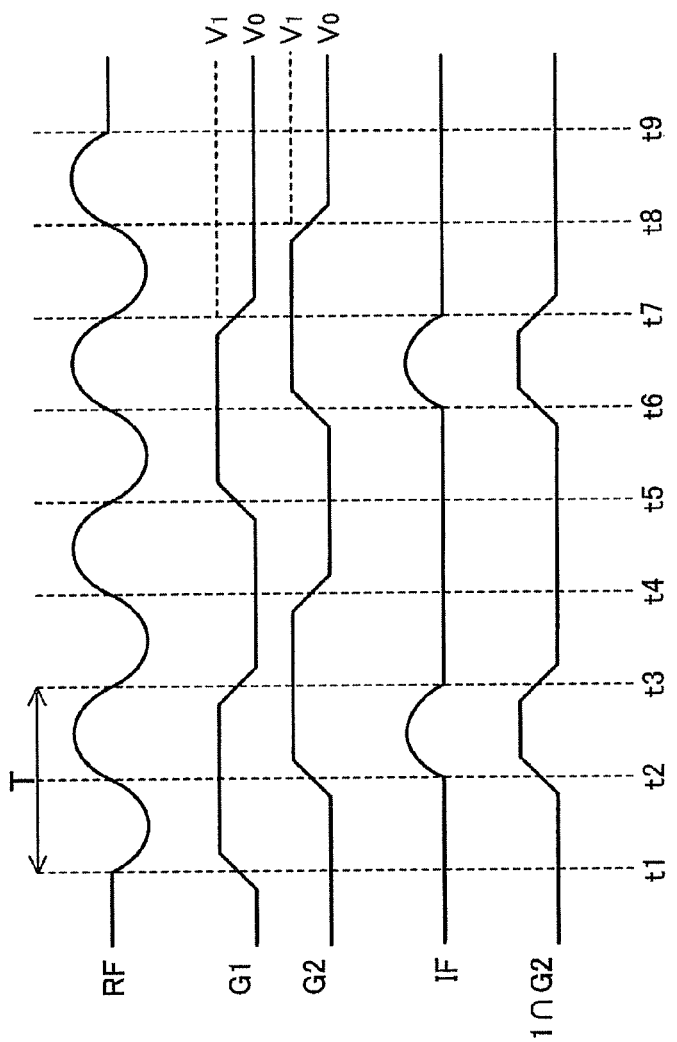
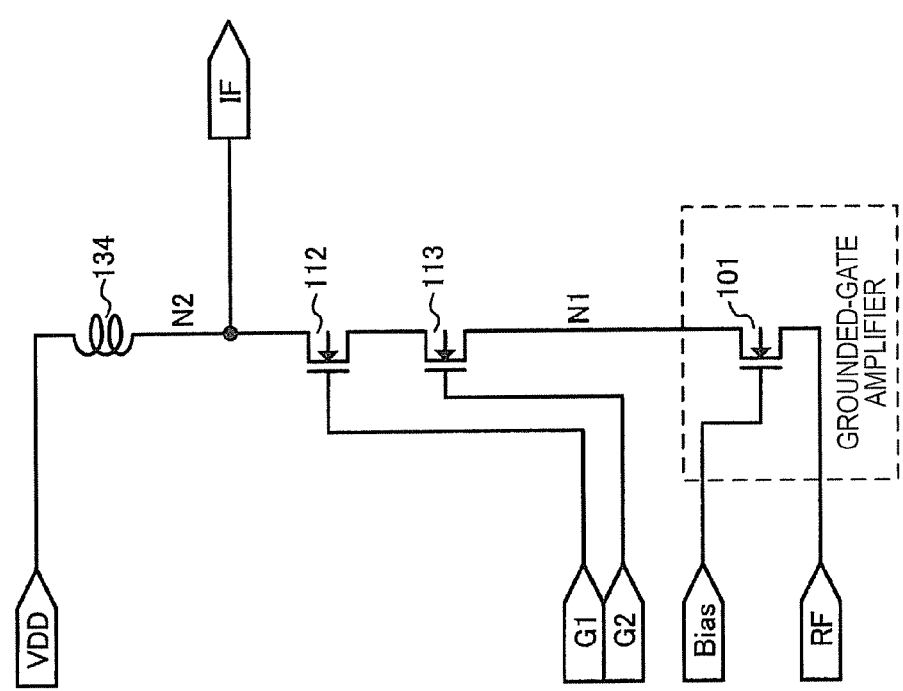
FIG. 6B
FIG. 6A

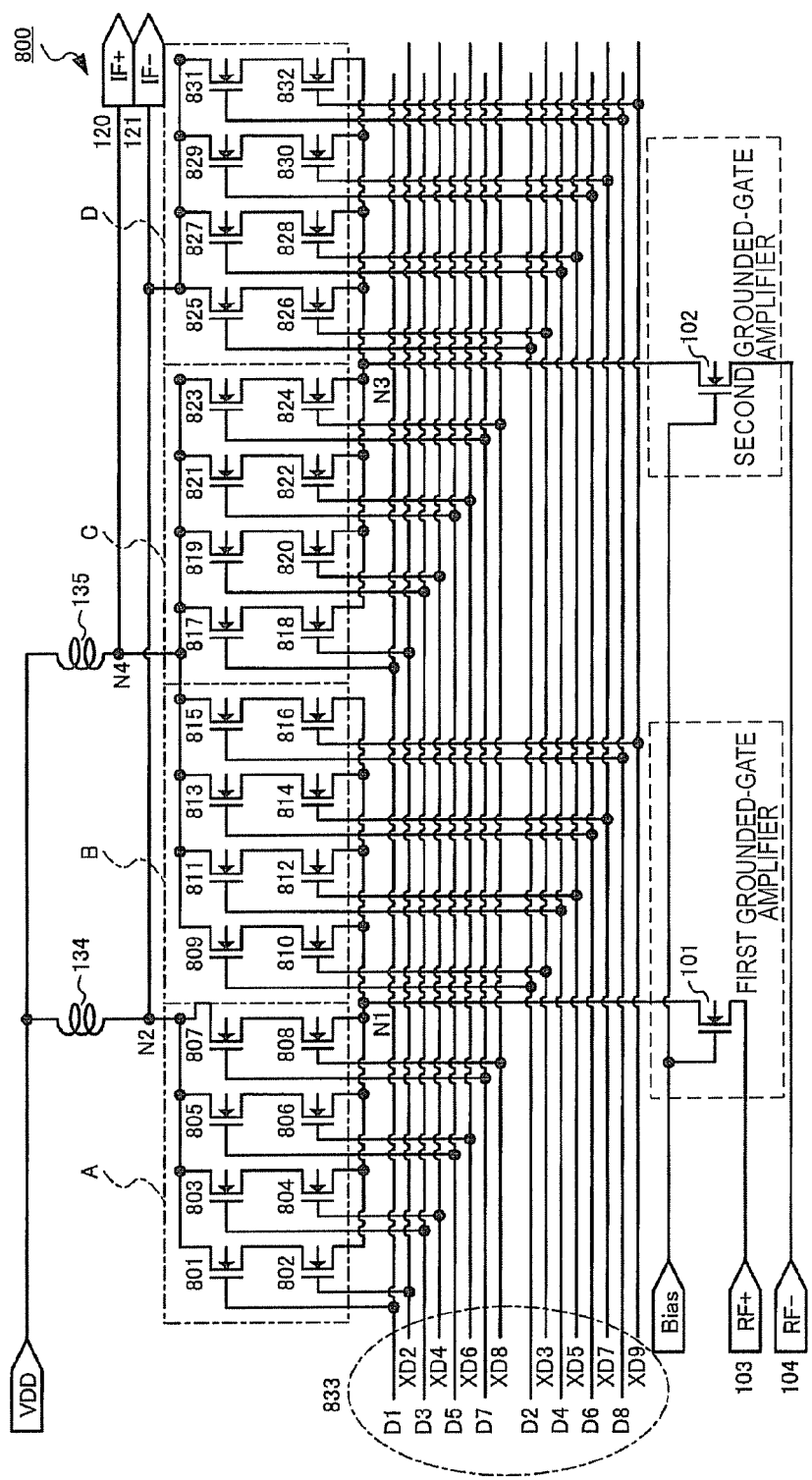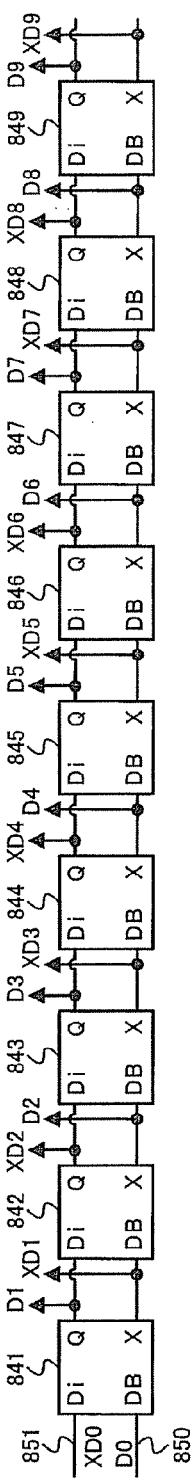
FIG.11A
FIG.11B

MIXER CIRCUIT, COMMUNICATION DEVICE, AND ELECTRONIC EQUIPMENT

BACKGROUND

1. Technical Field

The present invention relates to a mixer circuit, a communication device, and electronic equipment.

2. Related Art

Ultra Wide Band (UWB) communication is a kind of communication method for performing high-speed large-capacity data communication using a very wide frequency band. Although as the communication method using wide-band signals, there are cited a spread spectrum system and orthogonal frequency division multiplexing (OFDM) in the related art, the UWB is a further wide-band communication method using pulses with very short period of time, and is also called impulse radio (IR) communication. Hereinafter, the communication method will be described as a UWB-IR method or simply an IR method. In the IR method, modulation and demodulation can be performed only by time-base operations in contrast to the modulation in the related art, and simplification and reduction in power consumption of the circuit are considered to be expected (see specifications of U.S. Pat. No. 6,421,389 (Document 1), USP-A1-20030108133 (Document 2), and USP-A1-20010033576 (Document 3)).

Firstly, FIG. 15A shows a typical block diagram of the UWB communication device using the IR method in the related art, and FIGS. 15B and 15C show timing charts for explaining an outline of the operation thereof. The operation and the principle thereof will briefly be explained using these drawings.

The data to be transmitted is input in a terminal 1201. A pulse generation circuit 1202 generates wide band pulses. On this occasion, the pulse generation circuit 1202 receives the transmission signal input to the terminal 1201, and executes predetermined modulation on the pulses to be generated. As the modulation method, Pulse Position Modulation (PPM) for shifting the generation positions of the generated pulses, Bi-phase Modulation (BPM) for inverting the polarities of the generated pulses, and so on are often used. FIG. 15B shows waveforms of the PPM, and FIG. 15C shows waveforms of the BPM. In the drawings, solid lines and broken lines denote bit 1 and bit 0, respectively. The pulses thus generated and modulated are emitted to space via a transmitting antenna 1203.

Then, an outline of a typical receiving device of the related art will be explained. The signal received by a receiving antenna 1204 is amplified by a low-noise amplifier (LNA) 1205, and then transmitted to a mixer circuit 1206. On this occasion, an equalization process or the like for eliminating distortion caused in the transmission channel is executed if necessary. As an example of the distortion, there can be cited distortion caused by multipath, frequency shift caused by a Doppler effect, and so on.

The received signal amplified by the LNA 1205 is transmitted to the mixer circuit 1206, and multiplied by a template pulse generated by a template pulse generation circuit 1208. The mixer circuit 1206 is a kind of multiplication circuit, and outputs the multiplication value of two signals (the received signal and the template pulse in this case). The signal the mixer circuit 1206 has output is smoothed by an integration circuit 1210, and bit information transmitted from the result is discriminated by a discrimination circuit 1212, and then output from a terminal 1213 as a demodulated output. In other words, the mixer circuit 1206 and the integration circuit 1210 constitute a correlator, and calculate correlation between the received signal and the template pulse. The discrimination circuit 1212 performs determination (demodulation) of the transmitted signal based on the calculation result of the correlation.

Based on the timing charts shown in FIGS. 15B and 15C, an outline of the operation of the UWB communication device using the IR method of the related art is illustrated.

The explanation will be started from the operation of PPM along the chart shown in FIG. 15B. The received signal b received by the receiving antenna 1204 and then amplified by the LNA 1205 becomes to have a waveform shown in FIG. 15B. In the following explanations, it is assumed that the solid lines represent the case in which bit 1 is transmitted thereto, and the broken lines represent the case in which bit 0 is transmitted thereto. The template pulse generation circuit 1208 generates a template pulse c corresponding to bit 1 as shown in FIG. 15B. The mixer circuit 1206 multiplies the received signal b by the template pulse c to output a multiplication resultant signal e. The multiplication resultant signal e is integrated by the integration circuit 1210 to eliminate the high frequency component and to input to the discrimination circuit 1212, and then determined as the transmitted information in the discrimination circuit 1212 due to the magnitude of the correlation value.

Although the case of detecting the signal corresponding to bit 1 in the above description is explained, in the case of detecting the signal corresponding to bit 0, the template pulse generation circuit 1208 generates a template pulse d for bit 0 instead of the template pulse c for bit 1 to multiply the received signal b by the template pulse d, and then the mixer circuit 1206 multiplies the received signal b by the template pulse d to output a multiplication resultant signal f.

As described above, the receiving method for calculating the correlation with the template pulse for performing demodulation is generally called a synchronous detection method. In the synchronous detection method, it is required that the template pulse and the received signal are exactly the same in timing. In the example of the related art cited here, synchronization tracking is performed by controlling the template pulse generation timing of the template pulse generation circuit 1208 so that the correlation value becomes the maximum based on the determination result of the discrimination circuit 1212. Although this operation is not easy in general, it is thought to have become possible to perform the operation in a stable manner even at a high frequency due to the recent advancement of the device technology and the digital signal processing technology, by taking advantage thereof.

FIG. 15C is a chart for explaining an outline of the operation of the UWB transmission device using the IR method in the related art in the case of BPM. The received signal g received by the receiving antenna 1204 and then amplified by the LNA 1205 is multiplied by a template pulse h, which is generated by the template pulse generation circuit 1208, by the mixer circuit 1206 to form a multiplication resultant signal i. By eliminating the high frequency component from the multiplication resultant signal i by the integration circuit 1210, and determining whether the multiplication resultant signal i is positive or negative by the discrimination circuit 1212, whether the transmitted bit information is 1 or 0 can be determined. It is possible to use a low pass filter (LPF) as the integration circuit 1210, because it is equivalent to substantially obtain the correlation.

In the UWB communication with the IR method, the signal is intermittent, but is not continuous as in the narrow band communication of the related art. Therefore, it is known that power consumption of the entire receiving device can significantly be reduced by supplying the circuits of the receiver with power only when the received signal exists (or it is expected that the signal can be received), and blocking the circuits when no signal exists (see e.g., A CMOS IMPULSE RADIO ULTRA-WIDEBAND TRANSCEIVER FOR 1 Mb/s DATA COMMUNICATION AND ±2.5 cm RANGE FINDINGS T. Terada et al., 2005 Symposium on VLSI Circuits Digest of Technical Papers, pp. 30-33 (Document 4)).

In FIG. 15A, as the pulse generation circuit 1202 and the template pulse generation circuit 1208, the circuits described in the Document 4 and "A Low-Power Template Generator for Coherent Impulse-Radio Ultra Wide-Band Receivers, Jose Luis et al., Proceedings IEEE ICUWB, 2006 pp. 97-102" (Document 5) can be used. These circuits can be constituted by digital circuits, and designed so as to consume power only when the signal exists and not to consume power when no signal exists using complementary metal oxide semiconductor (CMOS). Particularly in the Document 5, it is possible to generate short pulses with a high frequency near the limit of the semiconductor elements constituting the circuit, and it is possible to generate pulses with such an extremely wide band as to be applied to UWB, namely pulses with short width. Moreover, it is possible to make the power consumption when no signal is generated, namely in the standby state, extremely low.

Further, in for example the Document 4 and "A 0.18 μm CMOS Switchable Low-Power LNA for Impulse Radio Ultra Wide-Band Receivers, E. Barajas et al., Proceedings IEEE ICUWB, 2006" (Document 6), there is introduced a low-noise amplifier 1205, which operates only in the case in which a signal exists, and has extremely small power consumption in the other cases.

FIG. 16 shows a low-noise amplifier 1300 of the Document 6. The low-noise amplifier 1300 uses two identical circuits 1311, 1312 for amplifying a differential signal. In the circuit 1311, the transistors 1301, 1302 form an amplifier having a grounded-source transistor 1301 and a grounded-gate transistor 1302 coupled in series in a manner called a cascade arrangement, which is often used as a low-noise amplifier.

A differential signal RF+ is applied to a terminal 1308, and then applied to the gate of the grounded-source transistor 1301 via a matching circuit composed of a capacitor 1305 and an inductor 1304. The signal amplified by the transistor 1301 is applied to the transistor 1302 with the gate grounded (Bias2) via a terminal 1306 to be amplified, and then a signal IF+ is taken out therefrom by the voltage drop caused by an inductor 1303.

A terminal 1309 is a terminal for providing bias (Bias1) to the gate of the grounded-source transistor 1301, and applies the bias (Bias1) thereto via a resistor 1310. Further, the terminal 1306 is for providing the bias (Bias2) to the gate of the transistor 1302, and the current flowing through the amplifier (the transistors 1301, 1302) can be controlled by controlling the bias (Bias2). Specifically, an appropriate bias voltage (Bias2) is applied when operating the amplifier, and the voltage value is minimized (e.g., the ground potential) when the operation of the amplifier is not required. On this occasion, since the current flowing through the paths of the inductor 1303 and the transistors 1301, 1302 becomes zero, it is possible to stop the operation by minimizing the potential (Bias2) applied to the terminal 1306 thereby making the circuit current zero when the operation of the amplifier is not required. In the UWB-IR, it is possible to reduce the power consumption of the low-noise amplifier by minimizing the potential of the terminal 1306 when no signal exists.

As the mixer circuit 1206 (FIG. 15A), a double balanced mixer circuit (also called a Gilbert circuit) often used in general can be used, and in the case of paying special attention to the power consumption, a passive mixer using a switching element such as a CMOS transistor can also be used.

It has been described above that in the communication device using the UWB-IR method shown in FIG. 15A, the power consumption of the entire circuit can be reduced by the technology of intermittent operation in which the circuit is made active only when a signal exists. It is obvious that each of the circuit elements constituting the communication device is required to operate so fast as to deal with the high-frequency wide-band signal of UWB-IR.

In particular, for the pulse generation circuit 1202, the template pulse generation circuit 1208, and the low-noise amplifier 1205, the circuits provided with high-speed operation performance and the intermittent operation functions are designed. However, no circuit suitable for such an operation exists in the mixer circuit (the multiplication circuit) 1206. The double balanced mixer circuit in the related art is not capable of such an intermittent operation as described above, and the passive mixer consuming no power has a problem of small conversion gain.

Further, in the related art, there is a problem that the low-noise amplifier, the mixer, and the template pulse generation circuit as essential constituents of the UWB-IR communication device, particularly in the receiving device thereof, are required to be designed individually, and then structured in combination.

SUMMARY

According to some aspects of the invention, a mixer circuit, a communication device, and electronic equipment capable of reducing the power consumption, and allowing simplification of the configuration can be provided.

An aspect of the invention relates to a mixer circuit including a grounded-gate amplifier disposed between an input node and a first node, and first through nth (n denotes an integer equal to or greater than 1) series transistor rows disposed between the first node and a second node, each of the first through nth series transistor rows includes two or more transistors coupled in series between the first node and the second node, and the transistors constituting the first through nth series transistor rows are controlled by first through mth (m denotes an integer equal to or greater than 2) control signals.

According to this aspect of the invention, by appropriately biasing the gate of the transistor constituting each of the series transistor rows with the first through mth control signals, it becomes possible to provide the mixer circuit with the function of the low-noise amplifier. Further, by modifying the signal waveform and so on of the first through mth control signals for controlling the series transistor rows, it is possible to make the mixer circuit perform various mixing operations.

Further, according to another aspect of the invention, it is also possible that at least one of the first through mth control signals is a control signal having a first voltage level switching off the transistor constituting the first through nth series transistor rows.

According to this configuration, when the operation of the circuit is not necessary, power consumption can be reduced by setting the operation of the mixer circuit in the off state. In particular, when dealing with the intermittent signal such as UWB-IR, the operation of the circuit is stopped when no pulse signal is input, thereby reducing power consumption.

Further, according to this aspect of the invention, it is also possible that at least one of the first through mth control signals is a control signal having a first voltage level switching off the transistor constituting the first through nth series transistor rows, and a second voltage level is a predetermined bias voltage provided to the transistor constituting the first through nth series transistor rows.

According to this configuration, the operation of the mixer circuit can be stopped by providing the voltage level switching off the series transistor rows when the operation of the mixer circuit is not necessary. Further, by setting the other voltage level to be the bias voltage to be applied to the series transistor rows, it becomes possible to configure the mixer circuit as a cascade amplifier, thus it becomes possible to provide the mixer circuit with the function of the low-noise amplifier in addition to the mixer function.

Further, according to this aspect of the invention, it is also possible that the first through mth control signals are signals with phases different from each other.

According to this configuration, any of the first through nth series transistor rows is selected, and the predetermined bias voltage or the voltage level for switching off the transistor can be applied to the selected series transistor row.

Further, according to this aspect of the invention, it is also possible that a signal amplified by the grounded-gate amplifier is output via any of the first through nth series transistor rows set in an on state by j (j denotes an integer satisfying $2 \leq j \leq m$) control signals out of the first through mth control signals.

According to this configuration, it is possible to select the series transistor row to be set in the on state and obtain the output signal based on the first through mth control signals. Further, by controlling the series transistor rows by the first through mth control signals, it becomes possible to generate the UWB-IR template signal in the mixer circuit in an equivalent manner.

Further, according to this aspect of the invention, it is also possible that the first through mth control signals include a pulse signal with a width larger than a width of a template pulse of UWB-IR signal.

According to this configuration, since it is possible to control the series transistor rows with the control signals having a width larger than the width of the template pulse of the UWB-IR signal, namely the lower frequency control signals, it becomes unnecessary to input a high frequency wide band signal such as the template pulse of the UWB-IR signal to the mixer circuit.

Further, according to this aspect of the invention, it is also possible that a load element disposed between the first power supply node and the second node is included.

According to this configuration, it is possible to provide the optimum load element to the amplifier composed of the grounded-gate amplifier and the series transistor rows.

Further, according to this aspect of the invention, it is also possible that the output signal is output from the second node.

According to this configuration, by selecting the load elements, the optimum output impedance can be obtained.

Further, according to this aspect of the invention, it is also possible that a current mirror circuit is provided as the load element, and the output signal is output from the output node of the current mirror circuit.

According to this configuration, it is possible to make the voltage drop by the load element smaller and obtain a signal with large amplitude.

Further, according to this aspect of the invention, it is also possible that a capacitor disposed between the output node and a second power supply node, and a switch element disposed between the output node and the second power supply node are included.

According to this configuration, since the sufficient performance as the integration circuit can be obtained, it becomes possible to make the circuit design easier.

Further, according to this aspect of the invention, it is also possible that a set of series transistor row is provided as the first through nth series transistor rows, first and second control signals are input as the first through mth control signals, the set of series transistor row includes a first transistor and a second transistor coupled in series between the first node and the second node, and the first transistor and the second transistor are respectively controlled by the first control signal and the second control signal.

According to this configuration, it is possible to amplify the input signal input thereto and output it based on the first and second control signals in the period in which the set of series transistor row is set in the on state.

Further, according to this aspect of the invention, it is also possible that first and second series transistor rows are provided as the first through nth series transistor rows, first through fourth control signals are input as the first through mth control signals, the first series transistor row includes a first transistor and a second transistor coupled in series between the first node and the second node, the second series transistor row includes a third transistor and a fourth transistor coupled in series between the first node and the second node, the first transistor and the second transistor are respectively controlled by the first control signal and the second control signal, the third transistor and the fourth transistor are respectively controlled by the third control signal and the fourth control signal.

According to this configuration, it is possible to amplify the input signal input thereto and output it based on the first through fourth control signals in the period in which either one of the first and second series transistor rows is set in the on state.

Further, according to this aspect of the invention, it is also possible that as the input node there are provided a first input node to which a first input signal constituting a set of differential input signals is input, and a second input node to which a second input signal constituting the set of differential input signals is input, as the grounded-gate amplifier there are provided a first grounded-gate amplifier disposed between the first input node and the first node, and a second grounded-gate amplifier disposed between the second input node and the third node, first through fourth series transistor rows are provided as the first through nth series transistor rows, first through fourth control signals are input as the first through mth control signals, the first series transistor row includes a first transistor and a second transistor coupled in series between the first node and the second node, the second series transistor row includes a third transistor and a fourth transistor coupled in series between the first node and the second node, the third series transistor row includes a fifth transistor and a sixth transistor coupled in series between the third node and the second node, the fourth series transistor row includes a seventh transistor and an eighth transistor coupled in series between the third node and the second node, the first transistor and the second transistor are respectively controlled by the first control signal and the second control signal, the third transistor and the fourth transistor are respectively controlled by the third control signal and the fourth control signal, the fifth transistor and the sixth transistor are respectively controlled by the second control signal and the third control signal, and the seventh transistor and the eighth transistor are respectively controlled by the first control signal and the fourth control signal.

According to this configuration, it becomes possible to amplify the first input signal thus input and then output it based on the first through fourth control signals in the period in which either one of the first and second series transistor rows is set in the on state, and to amplify the second input signal thus input and then output it in the period in which either one of the third and fourth series transistor rows is set in the on state.

Further, according to this aspect of the invention, it is also possible that as the input node there are provided a first input node to which a first input signal constituting a set of differential input signals is input, and a second input node to which a second input signal constituting the set of differential input signals is input, as the load element there are provided a first load element disposed between the first power supply node and the second node, and a second load element disposed between the first power supply node and the fourth node, as the grounded-gate amplifier there are provided a first grounded-gate amplifier disposed between the first input node and the first node, and a second grounded-gate amplifier disposed between the second input node and the third node, first through eighth series transistor rows are provided as the first through nth series transistor rows, first through fourth control signals are input as the first through mth control signals, the first series transistor row includes a first transistor and a second transistor coupled in series between the first node and the second node, the second series transistor row includes a third transistor and a fourth transistor coupled in series between the first node and the second node, the third series transistor row includes a fifth transistor and a sixth transistor coupled in series between the first node and the fourth node, the fourth series transistor row includes a seventh transistor and an eighth transistor coupled in series between the first node and the fourth node, the fifth series transistor row includes a ninth transistor and a tenth transistor coupled in series between the third node and the fourth node, the sixth series transistor row includes an eleventh transistor and a twelfth transistor coupled in series between the third node and the fourth node, the seventh series transistor row includes a thirteenth transistor and a fourteenth transistor coupled in series between the third node and the second node, the eighth series transistor row includes a fifteenth transistor and a sixteenth transistor coupled in series between the third node and the second node, the first transistor and the second transistor are respectively controlled by the first control signal and the second control signal, the third transistor and the fourth transistor are respectively controlled by the third control signal and the fourth control signal, the fifth transistor and the sixth transistor are respectively controlled by the second control signal and the third control signal, the seventh transistor and the eighth transistor are respectively controlled by the first control signal and the fourth control signal, the ninth transistor and the tenth transistor are respectively controlled by the first control signal and the second control signal, the eleventh transistor and the twelfth transistor are respectively controlled by the third control signal and the fourth control signal, the thirteenth transistor and the fourteenth transistor are respectively controlled by the second control signal and the third control signal, the fifteenth transistor and the sixteenth transistor are respectively controlled by the first control signal and the fourth control signal, a first differential output signal corresponding to the first input signal is output from the fourth node, and a second differential output signal corresponding to the second input signal is output from the second node.

According to this configuration, it becomes possible to amplify the first input signal thus input and then output the second differential output signal based on the first through fourth control signals in the period in which either one of the first and second series transistor rows is set in the on state, to amplify the first input signal thus input and then output the first differential output signal in the period in which either one of the third and fourth series transistor rows is set in the on state, to amplify the second input signal thus input and then output the first differential output signal in the period in which either one of the fifth and sixth series transistor rows is set in the on state, and to amplify the second input signal thus input and then output the second differential output signal in the period in which either one of the seventh and eighth series transistor rows is set in the on state.

Still another aspect of the invention relates to a communication device including the mixer circuit described above, and a control signal generation circuit adapted to generate the first through mth control signals.

According to this aspect of the invention, the mixer circuit can be provided with all of the function of the low-noise amplifier, the function of the mixer circuit, the function of synthesizing the template signal by the control signals, and the function of shutting down the circuit to save the power consumption. Further, since the input impedance thereof can be lowered, matching design of the input becomes easier. As a result, the configuration of the communication device using the present mixer circuit can extremely be simplified.

Further, according to this aspect of the invention, it is possible that the first through mth control signals are signals having at least a first frequency component and signals having a second frequency component, and a received signal frequency matches with either one of sum of the first frequency and the second frequency and difference between the first frequency and the second frequency.

According to this configuration, the received signal can directly be frequency-converted to the baseband, thus the configuration of the receiving device by the direct conversion process becomes possible. Moreover, since the local oscillation frequency identical to the frequency of the received signal is not used, the DC offset problem, which arises in the direct conversion receiving device in the related art, can be prevented.

Still another aspect of the invention relates to electronic equipment including the communication device described above.

BRIEF DESCRIPTION OF THE DRAWINGS

The invention will be described with reference to the accompanying drawings, wherein like numbers reference like elements.

FIGS. 6A and 6B are diagrams showing a first modified example of the mixer circuit.

FIGS. 11A and 11B are diagrams showing a third configuration example of the mixer circuit.

DESCRIPTION OF THE EMBODIMENT

Hereinafter, a preferred embodiment of the invention will be described in detail. It should be noted that the present embodiment explained below does not unreasonably limit the content of the invention as set forth in the appended claims, and all of the constituents set forth in the present embodiments are not necessarily essential as means for solving the problems of the invention.

1. First Configuration Example of Mixer Circuit

Figure 1:
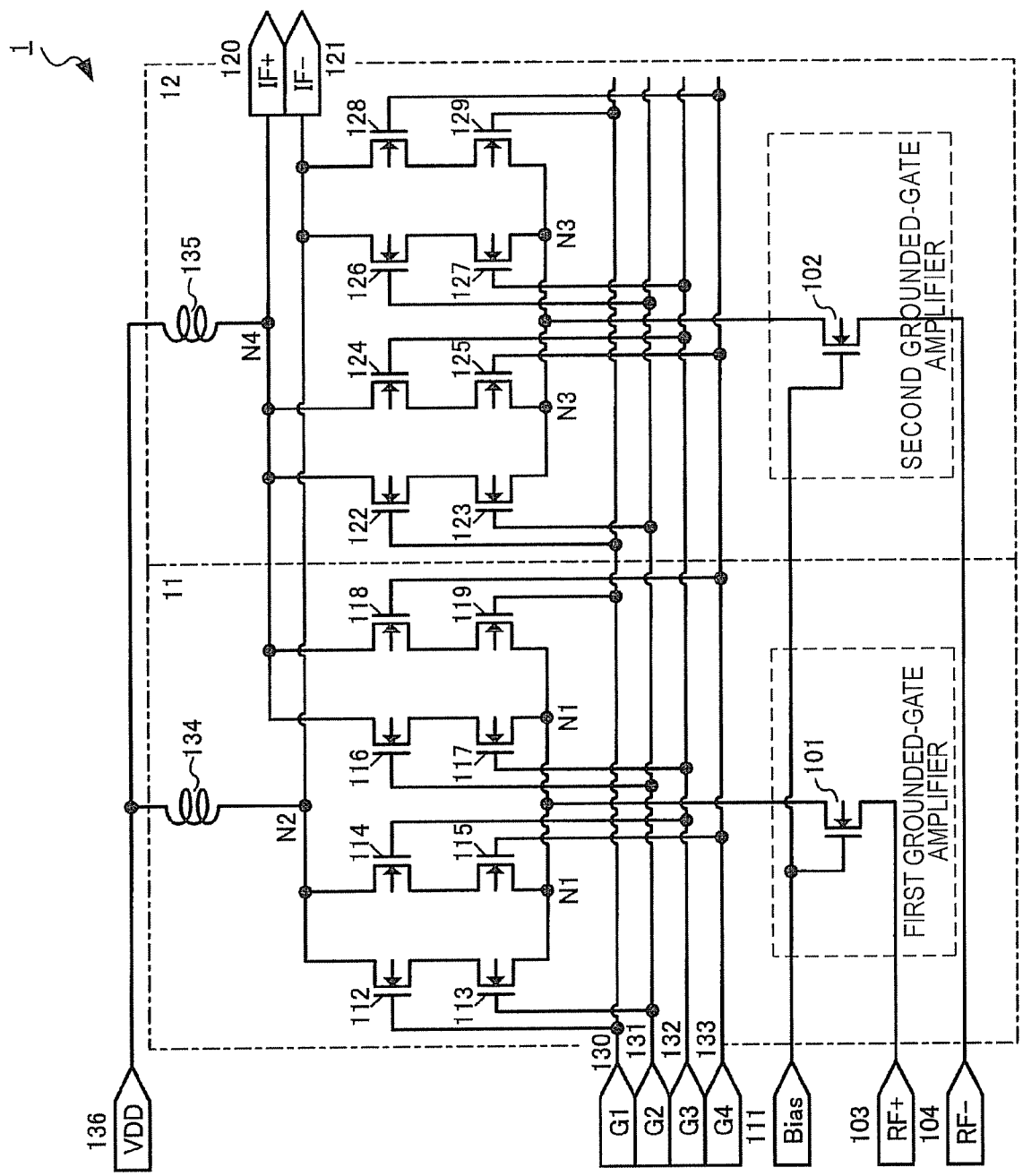
FIG. 1 is a diagram showing a first configuration example of a mixer circuit.
Figure 2:
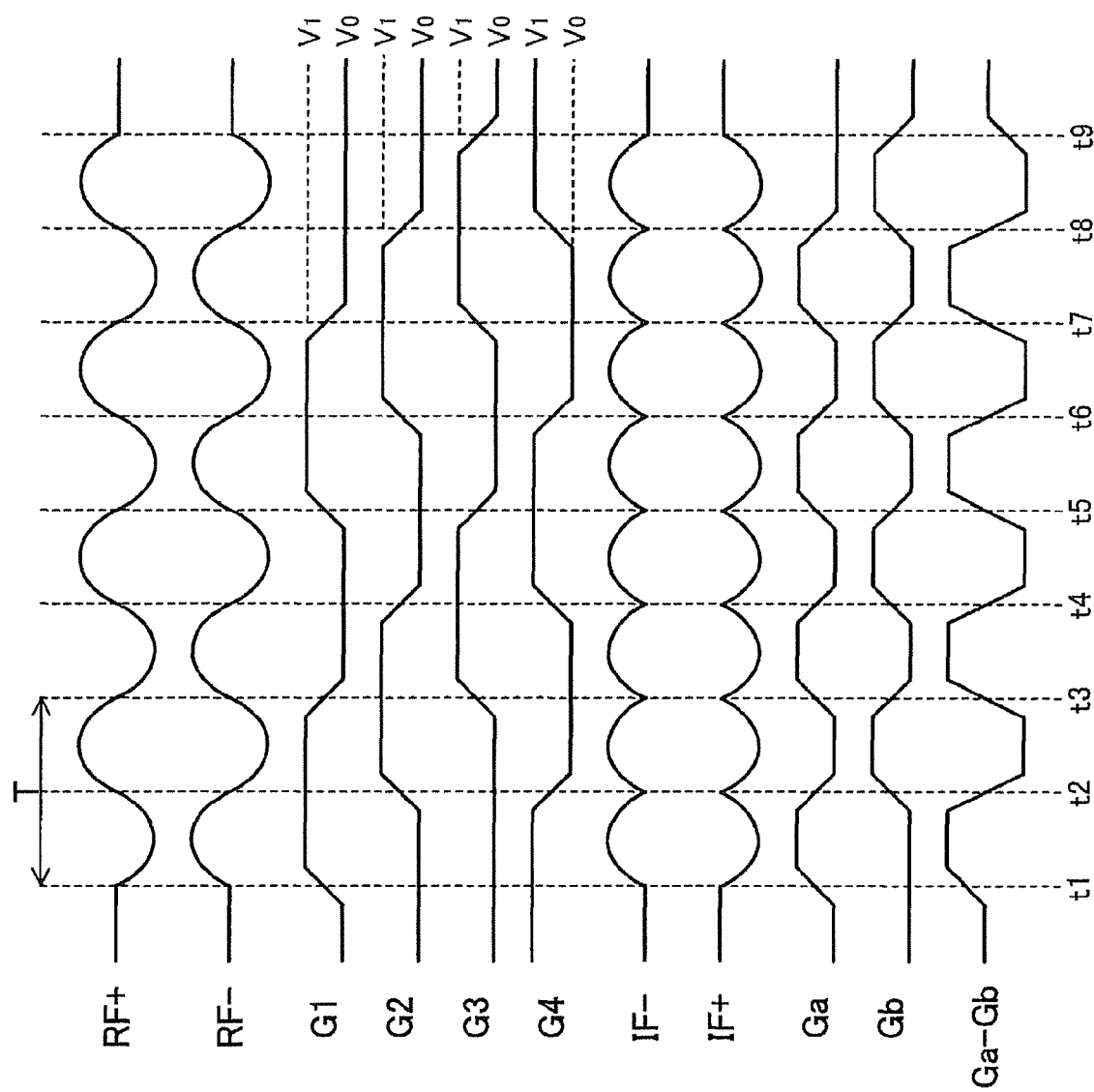
FIG. 2 is a chart for explaining an operation of the first configuration example of the mixer circuit.

Firstly, a first configuration example of a mixer circuit according to the present embodiment will be explained with reference to FIGS. 1 and 2. FIG. 1 is a circuit diagram showing a first configuration example of the mixer circuit according to the present embodiment. FIG. 2 is a timing chart showing an operation of the first configuration example of the mixer circuit according to the present embodiment. It should be noted that the mixer circuit of the present embodiment is not limited to the configuration shown in FIG. 1, and can be put into practice in variously modified forms such as elimination of some of the constituents, replacement with other constituents, or addition of other constituents.

As shown in FIG. 1, the mixer circuit of the present configuration example includes a first grounded-gate amplifier disposed between a first input node 103 and a first node N1 and a second grounded-gate amplifier disposed between a second input node 104 and a third node N3. The mixer circuit further includes first through eight series transistor rows (first through nth series transistor rows, n denoting an integer equal to or greater than 1, in the broad sense). Still further, the mixer circuit includes a first load element 134 disposed between a first power supply node 136 and a second node N2 and a second load element 135 disposed between the first power supply node 136 and a fourth node N4.

More specifically, the first series transistor row includes first and second transistors 112, 113 coupled in series between the first node N1 and the second node N2. Further, the second series transistor row includes third and fourth transistors 114, 115 coupled in series between the first node N1 and the second node N2. Further, the third series transistor row includes fifth and sixth transistors 116, 117 coupled in series between the first node N1 and the fourth node N4. Further, the fourth series transistor row includes seventh and eighth transistors 118, 119 coupled in series between the first node N1 and the fourth node N4.

Further, the fifth series transistor row includes ninth and tenth transistors 122, 123 coupled in series between the third node N3 and the fourth node N4. The sixth series transistor row includes eleventh and twelfth transistors 124, 125 coupled in series between the third node N3 and the fourth node N4. The seventh series transistor row includes thirteenth and fourteenth transistors 126, 127 coupled in series between the third node N3 and the second node N2. The eighth series transistor row includes fifteenth and sixteenth transistors 128, 129 coupled in series between the third node N3 and the second node N2.

The gates of these 16 transistors 112 through 119 and 122 through 129 are controlled by first through fourth control signals G1 through G4 provided to the terminals 130, 131, 132 and 133 (first through mth control signals, m being an integer equal to or greater than 2, in the broad sense) through the connection shown in FIG. 1.

Specifically, as shown in FIG. 1, the first and second transistors 112, 113 are controlled by the first and second control signals G1, G2. The third and fourth transistors 114, 115 are respectively controlled by the third and fourth control signals G3, G4. The fifth and sixth transistors 116, 117 are respectively controlled by the second and third control signals G2, G3. The seventh and eighth transistors 118, 119 are respectively controlled by the first and fourth control signals G1, G4.

Similarly, the ninth and tenth transistors 122, 123 are respectively controlled by the first and second control signals G1, G2. The eleventh and twelfth transistors 124, 125 are respectively controlled by the third and fourth control signals G3, G4. The thirteenth and fourteenth transistors 126, 127 are respectively controlled by the second and third control signals G2, G3. The fifteenth and sixteenth transistors 128, 129 are respectively controlled by the first and fourth control signals G1, G4.

As shown in FIG. 1, the mixer circuit 1 is composed of the same circuits 11, 12 bilaterally symmetric to each other in order for providing a balanced circuit dealing with a differential signal. The power supply terminal (the first power supply node) 136 is provided with the power supply voltage VDD.

The first and second input signals RF+, RF− forming a pair of differential input signals are input to the first and second input terminals (the input nodes) 103, 104. Here, as shown in FIG. 2, a pulse train with the cycle time T and the number of fingers of 4 cycles is cited as the UWB-IR signal, for example. The differential input signals RF+, RF− as shown in FIG. 2 can be obtained in, for example, the case of receiving the UWB-IR signal by a balanced antenna. These differential input signals RF+, RF− are applied to the sources of the respective transistors 101, 102 (the grounded-gate transistors).

The terminal 111 is a terminal for supplying the bias voltage Bias to be applied to the transistors 101, 102, and the bias voltage Bias is applied to the gates of the transistors 101, 102, thus the transistors 101, 102 operate as the first and second grounded-gate amplifiers, respectively.

The first and second transistors 112, 113 are two transistors (the first series transistor row) coupled in series between the first node N1 and the second node N2, and can be regarded as a single transistor with the channel length of L1+L2 assuming that the same voltage is applied to each of the gates thereof. Here, the reference symbols L1 and L2 denote the channel lengths of the transistors 112, 113, respectively. Regarding the transistors 112, 113 coupled in series as the single transistor, and assuming that the drain of the transistor 101 is connected thereto, these transistors 112, 113, 101 can be regarded to have the cascade arrangement of serially stacking two grounded-gate amplifiers.

Besides the first series transistor row composed of the two transistors 112, 113 coupled in series, described above, the second through fourth series transistor rows composed respectively of the two transistors 114, 115 coupled in series, the two transistors 116, 117 coupled in series, the two transistors 118, 119 coupled in series are coupled in parallel to the transistor 101 of the first grounded-gate amplifier.

The first through fourth control signals G1, G2, G3, G4 as shown in FIG. 2 are provided respectively to the terminals 130, 131, 132, 133. It is assumed that each of these control signals G1 through G4 takes two values, namely a first voltage level $V_0$ and a second voltage level $V_1$, and makes transitions with small transition time in the order shown in FIG. 2. In other words, the first through fourth control signals G1 through G4 (first through mth control signals, in the broad sense) are signals with phases different from each other. Further, the first through fourth control signals G1 through G4 include pulse signals with widths larger than the template pulses of the UWB-IR signal.

How such signals are made will be described later. Further, for the sake of later explanations, the time points at which the signals make transitions are defined as t1 through t9 as shown in the drawing. It should be noted that only the parts where the intermittent UWB-IR signals exist are enlargedly drawn in FIG. 2. In reality, the period before the time point t1 and the period after the time point t9 in which no signal exists are much longer than the period between the time point t1 and the time point t9.

Here, the first voltage level $V_0$ is defined as such a low voltage value as to switch of the transistors 112 through 119 and the transistors 122 through 129 in FIG. 1, and the second voltage level $V_1$ is defined as a gate bias value (a predetermined bias voltage) assuming that the transistors 112 through 119 and the transistors 122 through 129 coupled in series form a single transistor of the grounded-gate stage. By thus selecting the first and second voltage levels $V_0$, $V_1$, the transistors 112, 113 act as the grounded-gate stages in the period between the time points t2, t3 and the period between the time points t6 and t7 in which both of the control signals G1, G2 take the second voltage value $V_1$ as shown in FIG. 2. Similarly, the transistors 114, 115 act as the grounded-gate stages in the period between the time points t4 and t5 and the period between the time points t8 and t9 in which both of the control signals G3, G4 take the second voltage value $V_1$, the transistors 126, 127 act as the grounded-gate stages in the period between the time points t3 and t4 and the period between the time points t7 and t8 in which both of the control signals G2, G3 take the second voltage value $V_1$, and the transistors 128, 129 act as the grounded-gate stages in the period between the time points t1 and t2 and the period between the time points t5 and t6 in which both of the control signals G1, G4 take the second voltage value $V_1$.

Therefore, the signal amplified by the transistor 102 and further amplified by the grounded-gate stages by the series transistors 128, 129 in the period between the time points t1 and t2 is detected in the inductor (a first load element, in the broad sense) 134. Further, similarly in the period between the time points t2 and t3, the signal amplified by the transistor 101 and further amplified by the series transistors 112, 113 is detected in the inductor 134. Similarly as above, the drain outputs of the transistors 101, 102 are switched every half cycle T/2, the signal amplified by the grounded-gate stages by the series transistors is detected in the inductor 134, and is output from an output terminal 121 (a second node N2, in the broad sense) as a second differential output signal IF− corresponding to the second input signal RF−.

Meanwhile, the drain output of the transistor 101 is grounded-gate-amplified by the series transistors 116, 117 in the period between the time points t3 and t4 and the period between the time points t7 and t8, and by the series transistors 118, 119 in the period between the time points t1 and t2 and the period between the time points t5 and t6 through the connection complementary with the above, and further, the drain output of the transistor 102 is grounded-gate-amplified by the series transistors 122, 123 in the period between the time points t2 and t3 and the time period between the time points t6 and t7, and by the series transistors 124, 125 in the periods between the time points t4 and t5 and the period between the time points t8 and t9, and then the signals thus obtained are output from the output terminal 120 (the fourth node N4, in the broad sense) to the inductor (the second load element, in the broad sense) 135 as a first differential output signal IF+ corresponding to the first input signal RF+.

To summarize the above, the signal amplified by the grounded-gate amplifier is output via any of the series transistor rows among the first through eighth series transistor rows (the first through nth series transistor rows, n being an integer equal to or greater than 1, in the broad sense), which are set to be the ON state by the two control signals (j control signals, j being an integer satisfying $2 \leq j \leq m$, in the broad sense) among the first through fourth control signals G1 through G4 (the first through mth control signals, m being an integer equal to or greater than 2).

Applying the second voltage level $V_1$ and the first voltage level $V_0$ respectively to true and false of the binary signal, when the logical formula Ga=G1×G4+G2×G3 is true, the differential signal RF+ entering the input terminal 103 is amplified and then output to the output terminal 120, and further, the differential signal RF− entering the input terminal 104 is amplified and then output to the output terminal 121. Further, when the logical formula Gb=G1×G2+G3×G4 is true, the differential signal RF− entering the input terminal 104 is amplified and then output to the output terminal 120, and further, the differential signal RF+ entering the input terminal 103 is amplified and then output to the output terminal 121. When neither of the two logical formulas Ga, Gb is true, namely in the period before the time point t1 or the period after the time point t9, the mixer circuit 1 is shut down not to consume power. This means that when either one of the two logical formulas Ga, Gb is true, a result of multiplication between the difference Ga−Gb of the binary signals corresponding to these logical formulas Ga, Gb and the differential signals RF+, RF− is output.

Figure 15A:
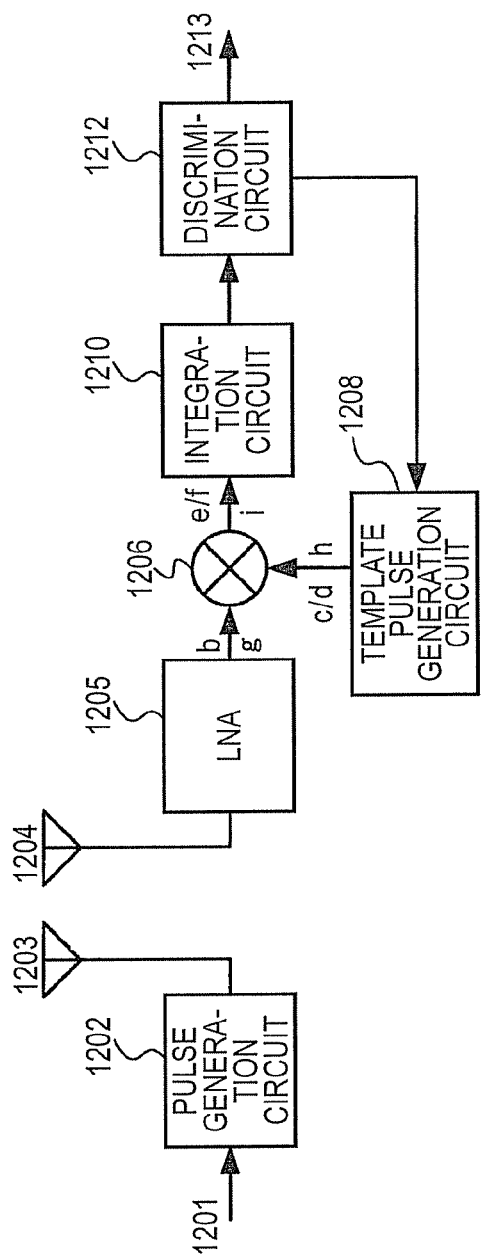
FIGS. 15A through 15C are diagrams showing a UWB-IR communication device in the related art, including a timing chart.
Figure 15C:
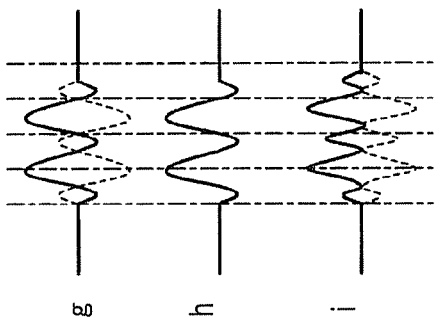
Figure 15B:
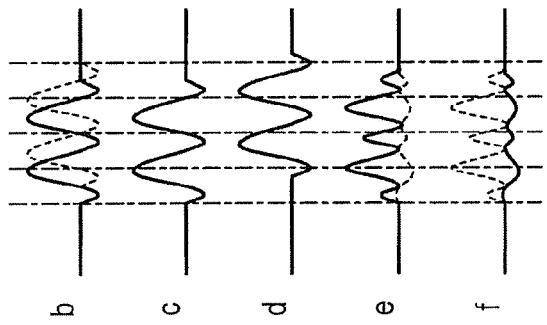
Figure 16:
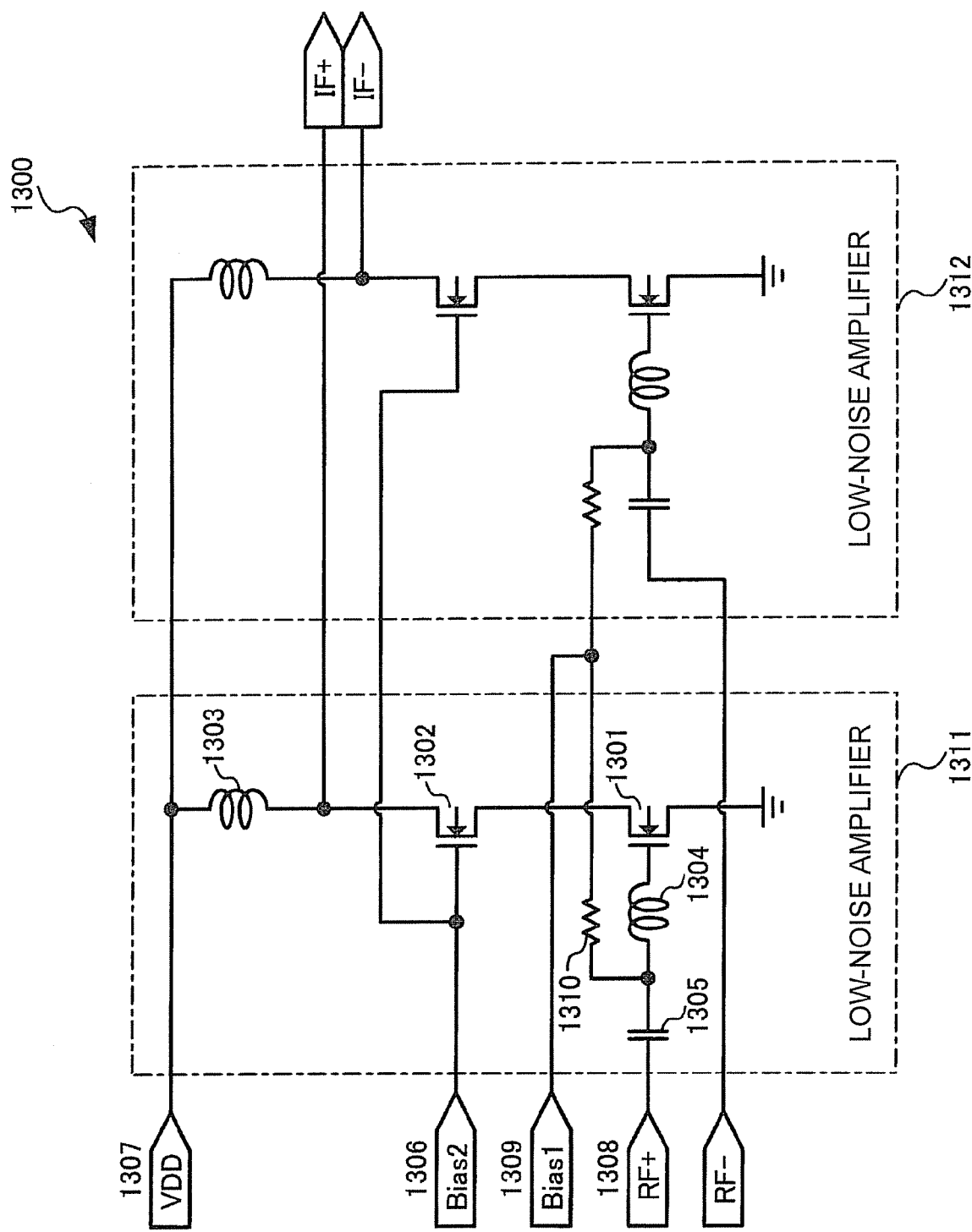
FIG. 16 is diagram showing a low-noise amplifier in the related art.

By setting the control signals G1 through G4 as shown in FIG. 2, the difference Ga−Gb of the binary signals shown in FIG. 2 becomes equivalent to the template signal used in the UWB-IR communication, and it becomes possible to make this single circuit have the functions of the low-noise amplifier, the multiplication circuit, and a part of the template pulse generation circuit. In other words, in the UWB-IR receiver configuration diagram of the related art shown in FIG. 15A, the circuit can be used as an alternative for the low-noise amplifier 1205, the multiplication circuit 1206, and a part of the template pulse generation circuit 1208. In the mixer circuit 1 of the present embodiment, there is no need for supplying the template pulses from the outside. In the UWB-IR communication, the speed of the template pulses used as the template signal is very high, and often becomes as high as the limit frequency of the element constituting the equipment. However, in the mixer circuit 1 of the present embodiment, there is no need for generating such a high-speed signal.

Further, since the mixer circuit 1 of the present embodiment does not consume power when no template pulse exists, the switch circuit for controlling switching on and off of the circuit power in the related art is not necessary.

Figure 3:
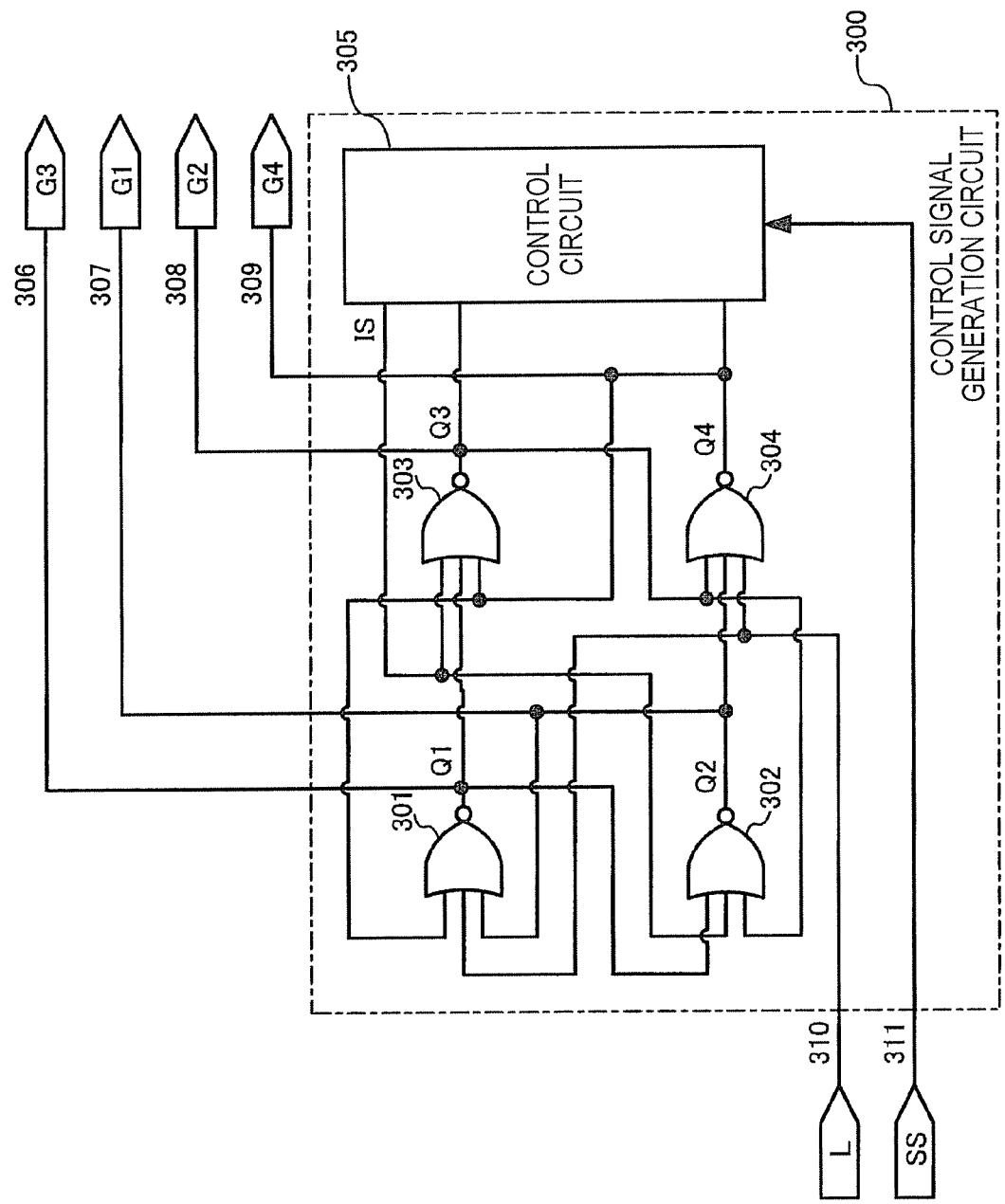
FIG. 3 is a diagram showing a configuration example of a control signal generation circuit.

FIG. 3 shows an example of a control signal generation circuit 300 for generating the control signals G1 through G4 explained above, and FIG. 4 is a timing chart of the control signal generation circuit 300 for generating the control signals G1 through G4. Hereinafter, for the sake of explanations, it is assumed that outputs of negative OR circuits (NOR) 301, 302, 303, 304 are defined as Q1, Q2, Q3, Q4, respectively, and descriptions such as (Q1, Q2, Q3, Q4)=(L, L, H, H) or simply (LLHH) are used for representing the states of the respective output values. This description represents the fact that the output values of the NOR 301, 302 are false, and the output values of the NOR 303, 304 are true.

Figure 4:
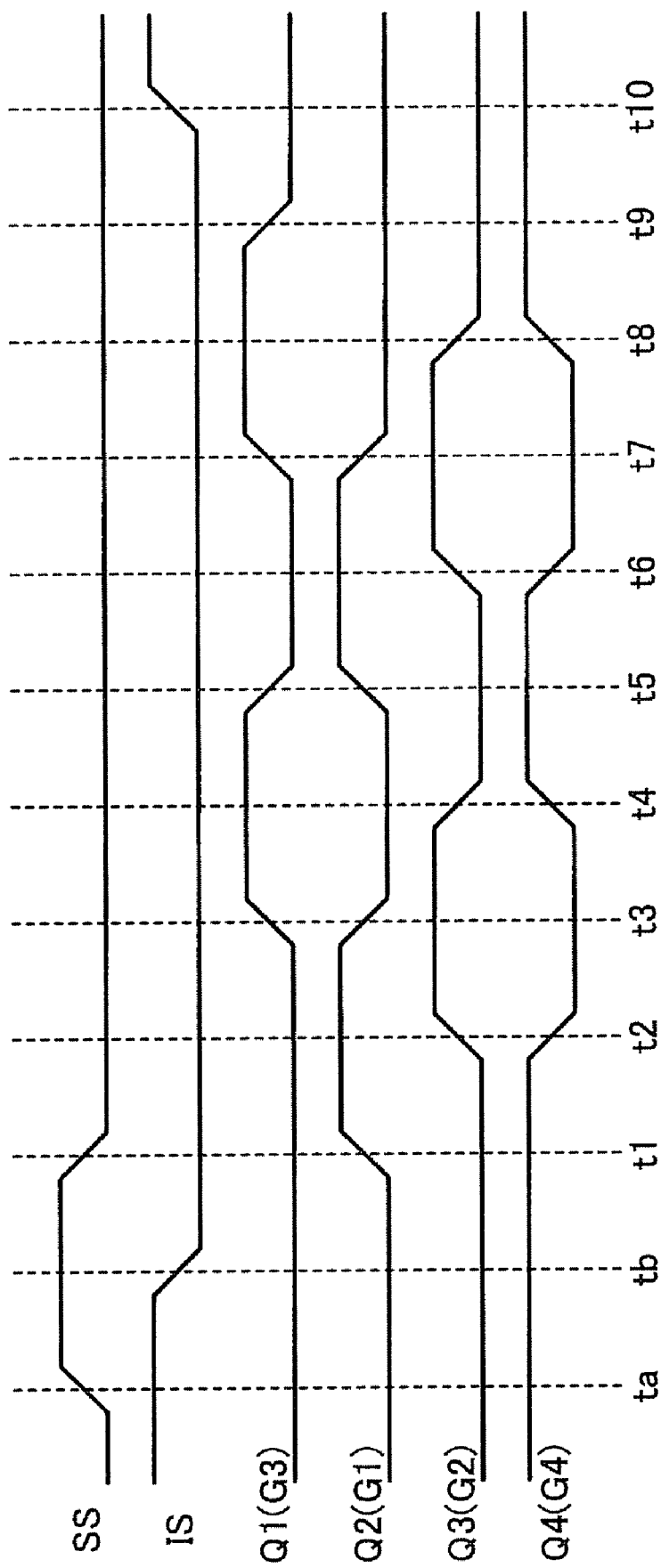
FIG. 4 is a chart for explaining an operation of the control signal generation circuit.

In response to a start signal SS, input to a terminal 311, shown in FIG. 4, the control circuit 305 generates an initialization signal IS for initializing the control signal generation circuit 300. Further, a false signal (L) is always input to a terminal 310. As the NOR 301, 304, which can be two-input NOR, three-input NOR are connected in order for keeping the NOR symmetrical with the NOR 302, 303. In the control signal generation circuit 300, the output signal Q1 of the NOR 301 is obtained as Q1=X(Q2+Q4), the output signal Q2 of the NOR 302 is obtained as Q2=X(Q1+Q3+IS), the output signal Q3 of the NOR 303 is obtained as Q3=X(Q1+Q4+IS), and the output signal Q4 of the NOR 304 is obtained as Q4=X(Q2+Q3) Here, X is a symbol representing negation of logic, and positioned in front of a logical formula or a logical value to, represent the negation of the logic thereof.

Hereinafter, the operation of the control signal generation circuit 300 shown in FIG. 3 will be explained with reference to the timing chart shown in FIG. 4.

Firstly, in the resting state on and before the time point tb, the initialization signal IS generated by the control circuit 305 is set to be in H, and therefore, (Q2, Q3)=(L, L) is obtained. Thus, (Q1, Q4)=(L, H) is obtained. In other words, on and before the time point tb, the state of (Q1, Q2, Q3, Q4)=(L, L, L, H) is continued to be kept.

When the start signal SS rises at the time point ta, the control circuit 305 makes the initialization signal IS fall in order for operating the circuit, in response thereto. Specifically, the control circuit 305 makes transition of IS=L at the time point tb with a delay from the time point ta.

When the initialization signal satisfies IS=L, the NOR 301 and the NOR 302 form an RS flip-flop circuit. The NOR 303 and the NOR 304 also form an RS flip-flop circuit in a similar manner, and are coupled so as to allow positive feedback, and therefore, the control signal generation circuit 300 starts oscillation. Specifically, with the delay of the circuit operation of the NOR, the output signals Q1, Q2, Q3, Q4 change in such a manner as (LHLH)→(LHHL)→(HLHL)→(HLLH) after the time point t1. The control circuit 305 monitors the output signal Q3 or Q4, and by setting the initialization signal to satisfy IS=H when the number of pulse fingers reaches a predetermined value, the oscillation described above can be stopped to restore the initial resting state.

By making correspondences of G1=Q2, G2=Q3, G3=Q1, and G4=Q4, the output signals Q1, Q2, Q3, Q4 described above become the control signals G1, G2, G3, G4 shown in FIG. 1. The template pulses formed by combining the output signals Q1, Q2, Q3, Q4 generated by the control signal generation circuit 300 can be set to have transition time determined in accordance with the delay amount of the NOR 301 through 304. Although it is capable of corresponding to such short template pulses as to be used in the UWB-IR communication, the control signals G1, G2, G3, G4 described above are signal with a speed much lower than the speed of the template pulses, which makes the circuit configuration of the control signal generation circuit 300 extremely easy. It should be noted that in a frequency adjustment in the case of using them as the template pulses, it is possible to tune the frequency to the target frequency in such a manner as to control the power supply voltage of the NOR 301 through 304, or to control the amount of load by additionally providing the output with a capacitor with a small capacitance as a load.

Figure 5:
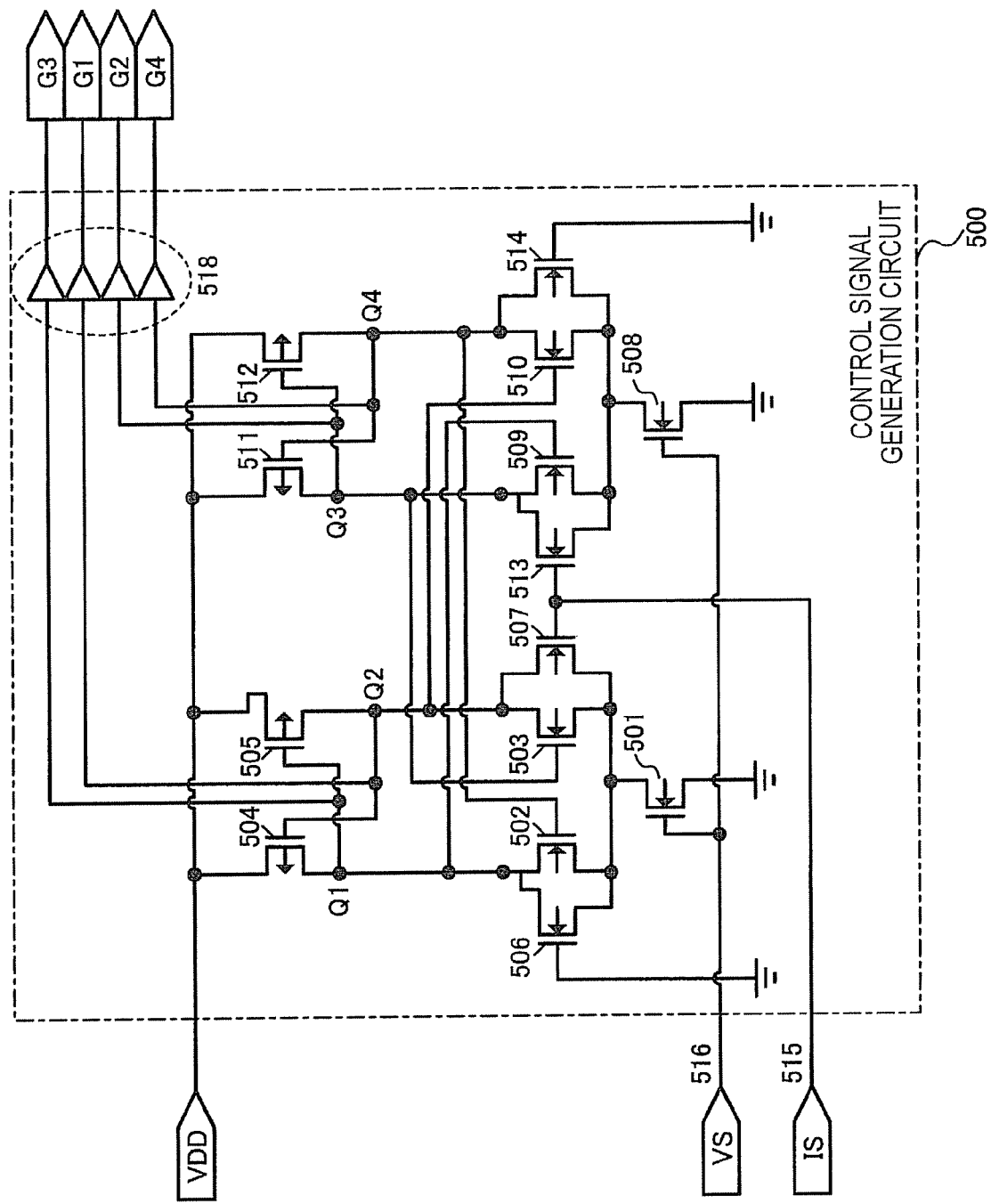
FIG. 5 is a diagram showing a configuration example of a control signal generation circuit.

FIG. 5 shows an example of the control signal generation circuit 500 for generating the control signals G1 through G4. In FIG. 5, a differential amplifier is composed of transistors 501, 502, 503, 504, 505. The N-channel transistor 501 forms a current source for limiting the circuit current, and limits the circuit current. By thus controlling the circuit current, the response time of the differential amplifier varies, and an amount of delay in transferring the signal can be controlled. In other words, the pulse width of the signal thus generated can be controlled in accordance with the voltage VS applied from the terminal 516 to the gate of the N-channel transistor 501.

The P-channel transistors 504, 505 are loads of a differential amplification stage formed of the N-channel transistors 502, 503, and the gates of the P-channel transistors 504, 505 are connected to each other's drains, thus forming a so-called cross-coupling circuit. According to this connection, the each other's, variations are emphasized and the shift in signal transition is minimized. An N-channel transistor 507 is a switch for setting the initial state, and is capable of switching the initial state with the operating state in accordance with the initialization signal IS applied to the terminal 515. In other words, in the case in which the potential of the initialization signal is high, the N-channel transistor 507 is forced to be switched on, the drain potential (Q2) of the P-channel transistor 505 is forced to be set in L, and the logical circuit 500 is set in the initial state. Further, in the case in which the potential of the initialization signal IS is low, the N-channel transistor 507 is switched off, and the control signal generation circuit 500 is set in the operating state. The N-channel transistor 506, which has a gate potential always set in the ground potential, is always set in the off state. The N-channel transistor 506, which has no direct influence on the operation, is added for obtaining a preferable balance (symmetrical property) of the differential amplifier.

The circuit composed of transistors 508 through 514 forms a differential amplifier similarly to the circuit composed of the transistors 501 through 507 explained above. By coupling the two differential amplifiers in series to have the connection shown in FIG. 5, thereby feeding back the output to the input side so as to form a positive feed back loop, the oscillation circuit with four-phase output is obtained. By controlling the initialization signal IS to be applied to the terminal 515 by the same operation of the circuit shown in FIG. 3, the control signals G1, G2, G3, G4 described above can be obtained. In other words, by using the output signals of the drains of the transistors 504, 505, 511, 512 as the output signals Q1, Q2, Q3, Q4, and buffer-amplifying the respective output signals by buffers 518 to be taken out, the control signals G3, G1, G2, G4 are respectively obtained.

According to the first configuration example of the mixer circuit of the present embodiment described above, the following advantages can be obtained.

According to the mixer circuit 1 of the present configuration example, the intermittent operation is possible, in which the mixer circuit 1 is shut down when the circuit operation is not necessary using the control signals G1 through G4 to be applied to the transistors coupled in series. Thus, if the mixer circuit 1 is used in the communication device with an intermittent signal such as a UWB-IR communication device, reduction in power consumption of entire device becomes possible.

Further, the mixer circuit 1 of the present configuration example can be regarded as a circuit obtained by incorporating the mixer in the grounded-gate stage in the cascade coupling arrangement of the low-noise amplifier, and therefore, it is possible to provide the function of the low-noise amplifier in addition to the mixer function. Moreover, in contrast to the fact that the current from the power supply flows separately through the low-noise amplifier and the mixer circuit, the path through which the current flows is integrated in the mixer circuit 1. Therefore, reduction of power consumed by the circuit in comparison with the circuit configuration in the related art becomes possible.

Further, in contrast to the fact that the template waveform is input to the mixer and multiplied by the received signal in the related art, the template pulses are synthesized using logical synthesis of the grounded-gate stage in the mixer circuit 1. Therefore, it is not necessary to input the template pulses to the mixer circuit 1, and it is sufficient to input the signal with frequencies extremely lower than those of the template pulses. In other words, it is not necessary to generate the template pulses to be input to the mixer circuit 1. Thus, in the case with, for example, UWB-IR, in which the template pulses with high frequencies near the limit of the circuit components need to be dealt with, the circuit design can be made extremely easy.

Further, in the configuration of the UWB-IR receiver of the related art, the template pulses to be input to the mixer are required to have large amplitude, and therefore, a drive circuit for amplifying the template pulses generated by an appropriate template pulse generation circuit is required. Designing these circuits brings difficulty because the frequency to be dealt with is high. However, in the present embodiment, since the template pulses can be synthesized by the combinations of the control signals input to the mixer circuit 1, the signals input to the mixer circuit 1 can be signals with frequencies substantially lower than the frequencies of the template pulses, and therefore, the design thereof is easy. The circuits such as the drive circuit necessary for the technology of the related art can be eliminated, which makes further reduction in power consumption possible. Further, since the input stage is also formed of the grounded-gate amplifier, the input impedance can be set to be a low value, and therefore, a preferable input matching characteristic can be obtained, thus making the design easier.

Further, in the case in which the receiver using a so-called direct conversion method for dropping, the received signal directly to the base band is formed using the mixer circuit of the related art, there arises a serious problem of causing a so-called DC offset that a local signal generated by a local oscillator leaks into a radio signal (a differential signal RF) side, and is then reflected by mismatch in the circuit or the like, and further converted into a direct-current component by the local signal of itself. In the mixer circuit 1 of the present embodiment, since the signal corresponding to the local signal can be arranged not to have the same frequency component as the radio signal, such a problem as the DC offset described above does not arise. The mixer circuit 1 of the present embodiment also has a significant advantage in the communication of the narrow band signal in the related art.

2. Modified Example of Mixer Circuit

Hereinafter, as modified examples of the first configuration example of the mixer circuit described above, first through sixth modified examples will be explained.

FIG. 6A shows a first modified example of the mixer circuit. In the first modified example, one series transistor row is provided, and the first and second control signals G1, G2 are input. The series transistor row includes the first and second transistors 112, 113 coupled in series between the first node N1 and the second node N2. The first and second transistors 112, 113 are respectively controlled by the first and second control signals G1, G2.

FIG. 6B is a diagram for explaining an operation of the first modified example. In the first modified example, in the period in which the first and second control signals G1, G2 are both in the second voltage level $V_1$, namely the period between the time points t2 and t3 and the period between the time points t6 and t7, the first and second transistors 112, 113 constituting the series transistor row are set in the on state. In the period described above, the input signal RF thus input is amplified and output from the second node N2 as the output signal IF.

As described above, according to the first modified example, the result of multiplication between the logical product of the control signals G1, G2 and the input signal RF is output. According to this modified example, it is possible to deal with a single-ended signal, the number of components is reduced, and the power consumption can also be reduced although the gain is dropped.

Figure 7B:
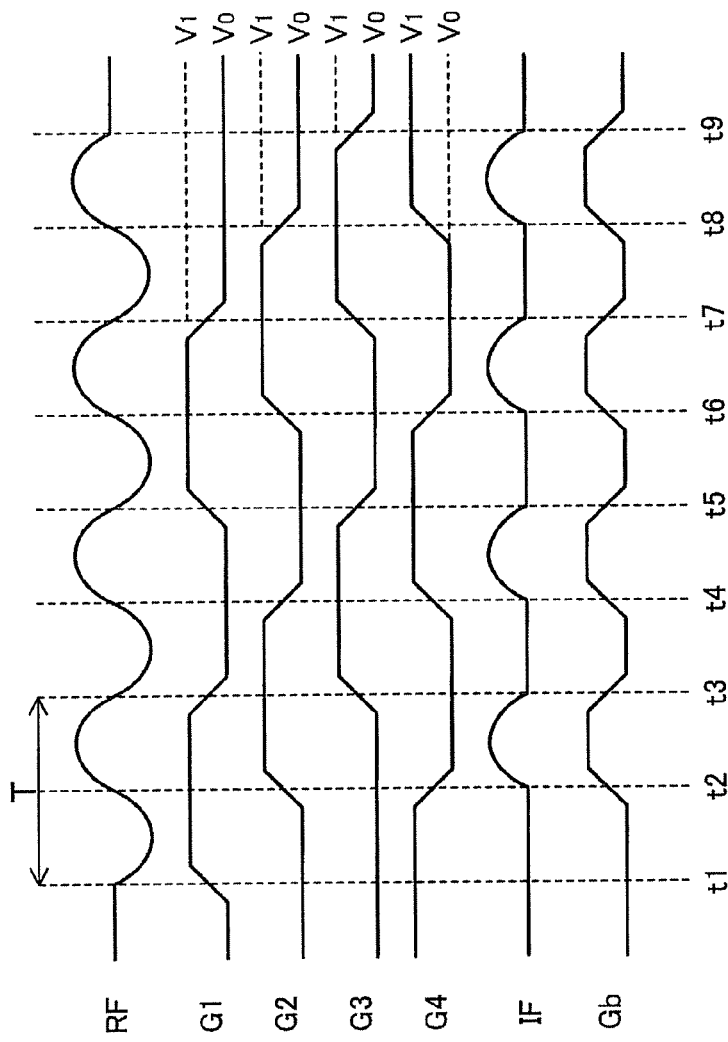
FIGS. 7A and 7B are diagrams showing a second modified example of the mixer circuit.
Figure 7A:
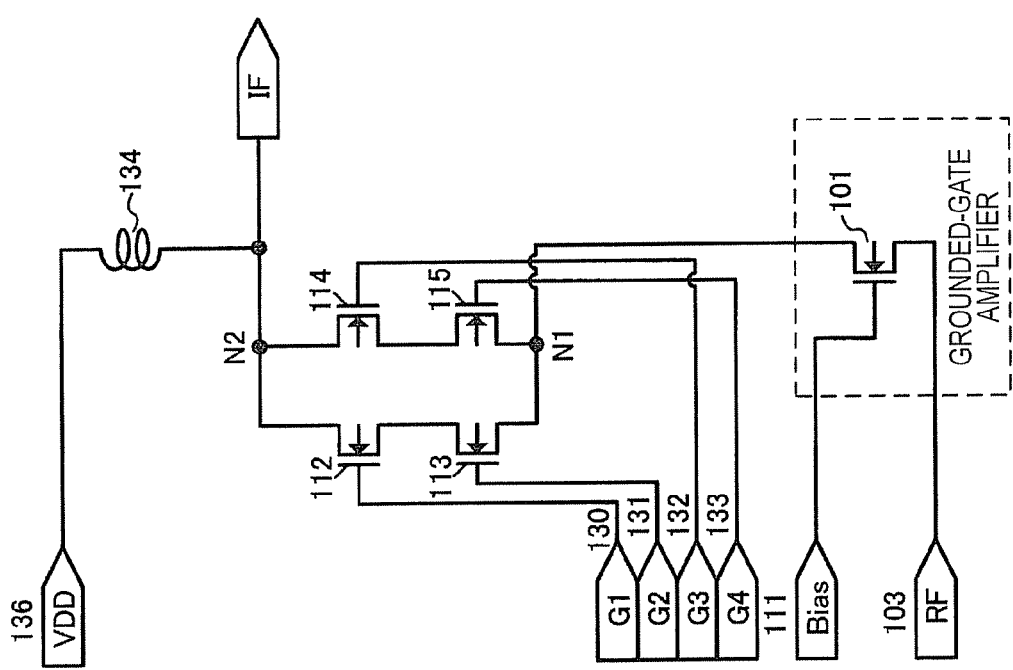

FIG. 7A shows a second modified example of the mixer circuit. In the second modified example, the first and second series transistor rows are provided, and the first through fourth control signals G1 through G4 are input. The first series transistor row includes the first and second transistors 112, 113 coupled in series between the first node N1 and the second node N2, and the second series transistor row includes the third and fourth transistors 114, 115 coupled in series between the first node N1 and the second node N2. The first and second transistors 112, 113 are controlled respectively by the first and second control signals G1, G2, and the third and fourth transistors 114, 115 are controlled respectively by the third and fourth control signals G3, G4.

FIG. 7B is a diagram for explaining an operation of the second modified example. In the second modified example, in the period in which the control signals G1, G2 are both set in the second voltage level $V_1$, and in the period in which the control signals G3, G4 are both set in the second voltage level $V_1$, namely the period between the time points t2 and t3, the period between the time points t4 and t5, the period between the time points t6 and t7, and the period between the time points t8 and t9, the input signal RF thus input is amplified and then output from the second node N2 as the output signal IF.

As described above, according to the second modified example, the input signal RF is amplified and then output when the logical formula Gb=G1×G2+G3×G4 is true. In other words, the result of multiplication between the logical formula Gb and the input signal RF is output. According to this modified example, it is possible to deal with a single-ended signal, the number of components is reduced, and the power consumption can also be reduced although the gain is dropped.

Figure 8A:
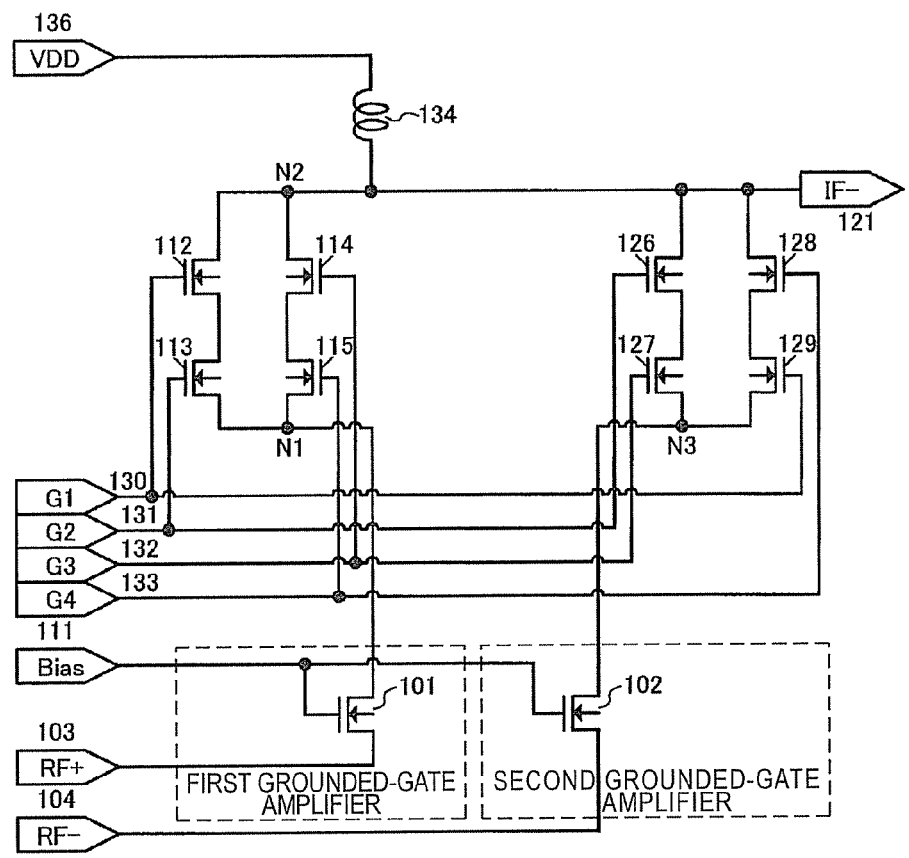
FIGS. 8A and 8B are diagrams showing a third modified example of the mixer circuit.

FIG. 8A shows a third modified example of the mixer circuit. In the third modified example, as, the input nodes, there are provided a first input node 103 to which the first input signal RF+ constituting a set of differential input signals is input, and a second input node 104 to which the second input signal RF− constituting the set of differential input signals is input.

Further, as the grounded-gate amplifier, there are included a first grounded-gate amplifier disposed between the first input node 103 and the first node N1, and a second grounded-gate amplifier disposed between the second input node 104 and the third node N3.

Further, the first through fourth series transistor rows are provided, and the first through fourth control signals G1 through G4 are input.

The first series transistor row includes the first and second transistors 112, 113 coupled in series between the first node N1 and the second node N2. The second series transistor row includes the third and fourth transistors 114, 115 coupled in series between the first node N1 and the second node N2. The third series transistor row includes the fifth and sixth transistors 126, 127 coupled in series between the third node N3 and the second node N2. The fourth series transistor row includes the seventh and eighth transistors 128, 129 coupled in series between the third node N3 and the second node N2.

The first and second transistors 112, 113 are respectively controlled by the first and second control signals G1, G2. The third and fourth transistors 114, 115 are respectively controlled by the third and fourth control signals G3, G4. The fifth and sixth transistors 126, 127 are respectively controlled by the second and third control signals G2, G3. The seventh and eighth transistors 128, 129 are respectively controlled by the first and fourth control signals G1, G4.

Figure 8B:
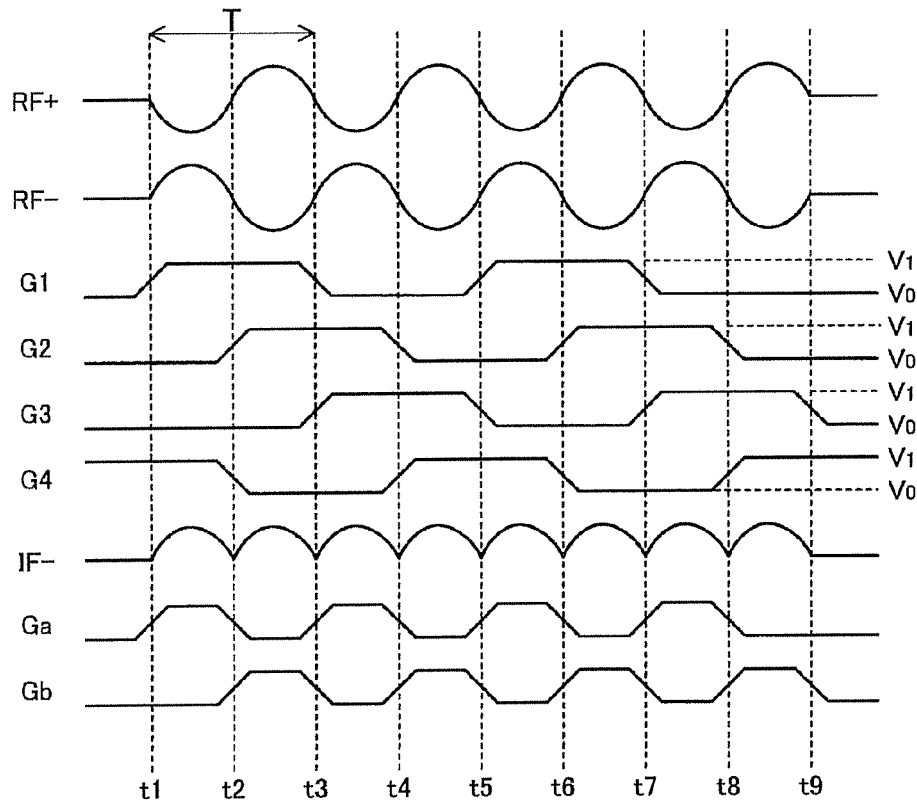

FIG. 8B is a diagram for explaining an operation of the third modified example. In the third modified example, in the period in which the control signals G1, G2 are both set in the second voltage level $V_1$, and in the period in which the control signals G3, G4 are both set in the second voltage level $V_1$, namely the period between the time points t2 and t3, the period between the time points t4 and t5, the period between the time points t6 and t7, and the period between the time points t8 and t9, the first input signal RF+ thus input is amplified and then output from the second node N2 as the output signal IF−. Further, in the period in which the control signals G1, G2 are both set in the second voltage level $V_1$, and in the period in which the control signals G3, G4 are both set in the second voltage level $V_1$, namely the period between the time points t1 and t2, the period between the time points t3 and t4, the period between the time points t5 and t6, and the period between the time points t7 and t8, the second input signal RF− thus input is amplified and then output from the second node N2 as the output signal IF−.

As described above, according to the third modified example, when the logical formula Ga=G1×G4+G2×G3 is true, the second input signal RF− input to the second input node 104 is amplified and then output. Further, when the logical formula Gb=G1×G2+G3×G4 is true, the first input signal RF+ input to the first input node 103 is amplified and then output. In other words, the logical sum of the logical product between the logical formula Ga and the second input signal RF− and the logical product between the logical formula Gb and the first input signal RF+(Ga×RF−+Gb×RF+) is output.

According to this modified example, it is possible to amplify the differential input signal to obtain the single-ended output signal, and further, a higher gain can be obtained in comparison with the two modified examples described above. Further, it is possible to reduce the number of components and the power consumption by half in comparison with the first configuration example.

A fourth modified example will hereinafter be described. Although the explanations are presented in the first configuration example of the mixer circuit described above exemplifying the case of using the MOS transistors, the transistors are not limited to the MOS transistors. By using bipolar transistors, respectively replacing the corresponding electrodes, namely replacing the sources with emitters, the gates with bases, and the drains with collectors, and providing appropriate bias, it is possible to make the mixer circuit operate in completely the same manner.

A fifth modified example will hereinafter be described. If the number of transistors constituting the grounded-gate stage is set to be three or more instead of two, a wider variety of control using combinations of the control signals becomes possible, and in the case in which a certain restriction is applied to generation of the control signals, the restriction can be eased.

A sixth modified example will hereinafter be explained. Although two identical circuits are used to deal with the differential signal in the first configuration example of the mixer circuit described above, it is possible to further reduce the common-mode gain by connecting the source of each of the transistors 101, 102 of the input grounded-gate stage to a current source, and controlling the current flowing through the both transistors to be always constant, and it is also possible to further enhance the effect of the differential amplification.

3. Second Configuration Example of Mixer Circuit

Then, a second configuration example of the mixer circuit of the present embodiment will be explained. In the first configuration example (FIG. 1), the current signal thus amplified is converted into voltage using the inductors 134, 135 to be taken out. In the case in which a mixer circuit (a multiplication circuit) is used for frequency conversion as a multiplication circuit used for the UWB-IR or a mixer circuit of a receiver, the frequency of the signal to be taken out generally becomes lower in comparison with the input signal. In such a case, if it is attempted to take out the signal using an inductor, a large inductance is required for the inductor. In the case in which the inductance is provided on an integrated circuit, it becomes difficult to implement a large inductance with which a sufficient amplitude value can be obtained, and in such a case, the signal amplitude may sometimes become small.

Figure 9:
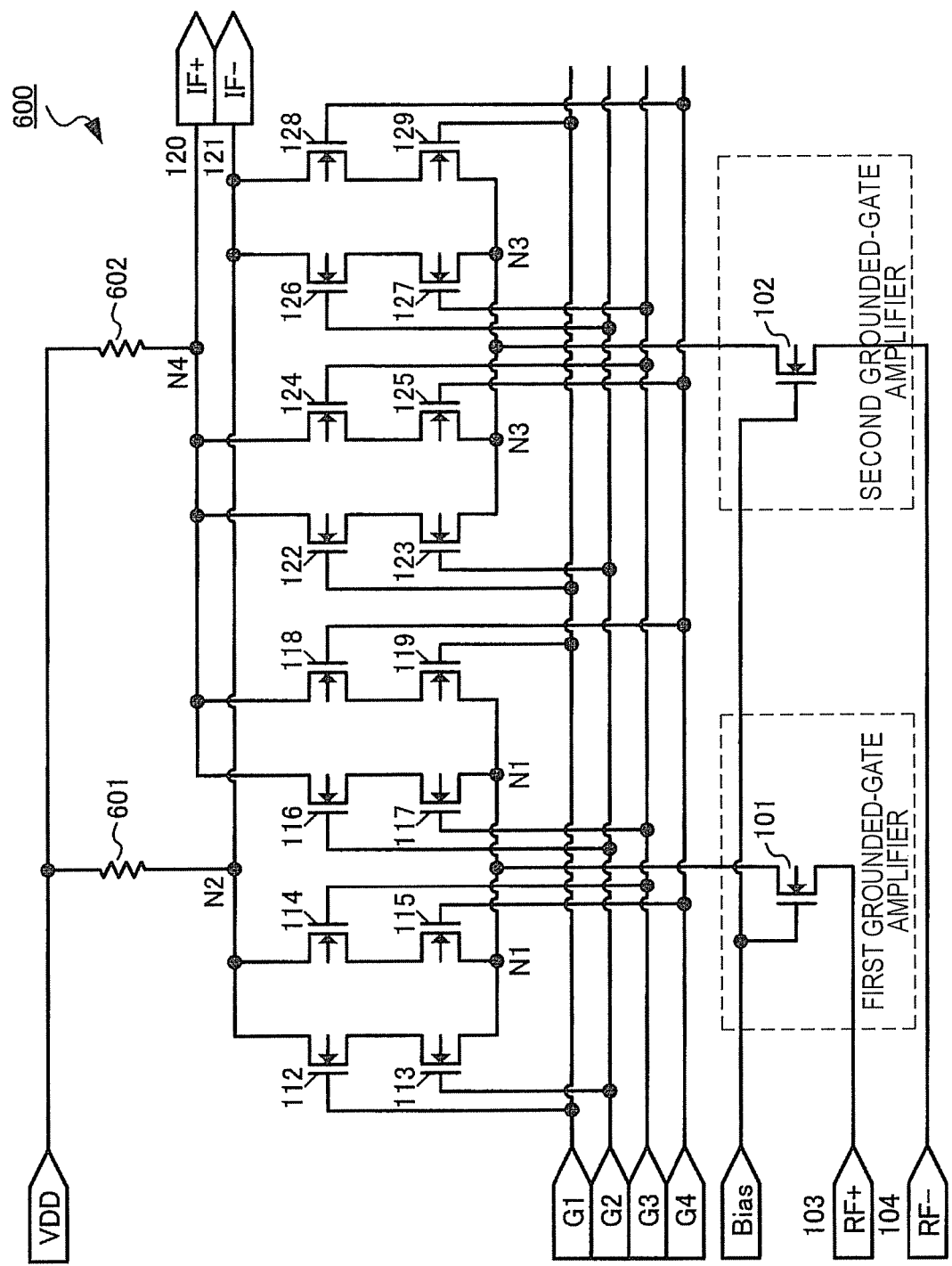
FIG. 9 is a diagram showing a second configuration example of the mixer circuit.

In the second configuration example, there are shown two examples for coping with such a case as described above. FIG. 9 shows an example of the mixer circuit 600 having resistors 601, 602 connected instead of the inductors 134, 135 shown in FIG. 1. By configuring as described above, it becomes possible to take out a signal with a low frequency component independently of the inductance value. In the mixer circuit 600 shown in FIG. 9, in order for taking out a large signal, a large voltage drop is caused by the resistors 601, 602. Therefore, it is required to increase the power supply voltage VDD in order for obtaining a large signal.

Figure 10:
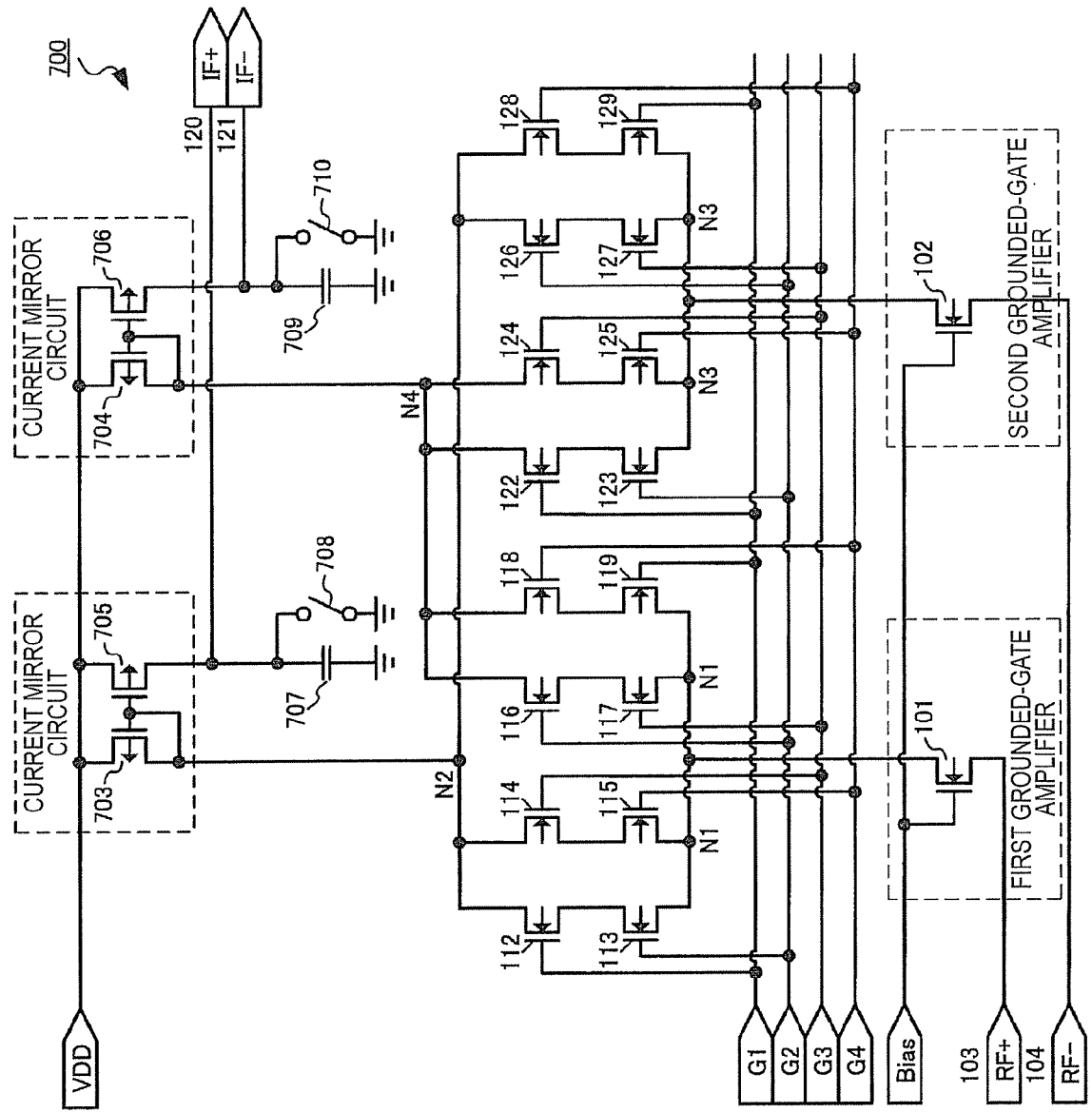
FIG. 10 is a diagram showing another example of the second configuration example of the mixer circuit.

FIG. 10 shows an example of the mixer circuit 700 capable of taking out a large signal without a large voltage drop. There are disposed current mirror circuits as the load elements, and the output signals are output from the respective output nodes of the current mirror circuits. The P-channel transistors 703, 704 are connected as diodes, and respectively form current mirror circuits with the P-channel transistors 705, 706. Specifically, the signal currents detected by the P-channel transistors 703, 704 are copied by the P-channel transistors 705, 706, and then output.

Since these current mirror circuits are current sources, and have sufficiently high impedance, the design of integration circuits coupled thereto at the posterior stages for constituting correlation circuits is easy. Specifically, sufficient performance can be obtained by only disposing capacitors 707, 709 between the first and second output nodes 120, 121 and the second power supply node (ground, VSS), respectively. It should be noted that switch elements 708, 710 disposed between the first and second output nodes 120, 121 and the second power supply node are reset switches for discharging electricity charged in the capacitors to restore the initial state at the start of the integration.

4. Third Configuration Example of Mixer Circuit

Then, a third configuration example of the mixer circuit of the present embodiment will be explained. In the first configuration example, four series transistor rows of the grounded-gate stages are connected to each of the input grounded-gate stages. By increasing the number of grounded-gate stages, the pulse width of the control signals can be elongated. Thus, the frequency component of the control signals becomes lower, which makes the circuit design easier.

In the third configuration example, there is shown a mixer circuit capable of performing multiplication of the template pulses with the number of pulse fingers of 4, for example, similarly to the first configuration example only by a single transition of the control signals using the eight grounded-gate stages composed of the series transistor rows. It should be noted that the present configuration example is not limited to the case described above, and by increasing the number of grounded-gate stages, it becomes possible to detect the pulses with a larger number of pulse fingers.

FIG. 11A shows a third configuration example of the mixer circuit of the present embodiment. FIG. 11B shows an example of the control signal generation circuit. In FIG. 11A, the circuit is the same as shown in FIG. 1 except the grounded-gate stages formed of the series transistor rows, and the sections performing the same operation as that of the circuit shown in FIG. 1 is denoted with the same reference numerals as shown in FIG. 1, and the explanations therefor will be omitted for the sake of simplification.

Figure 12:
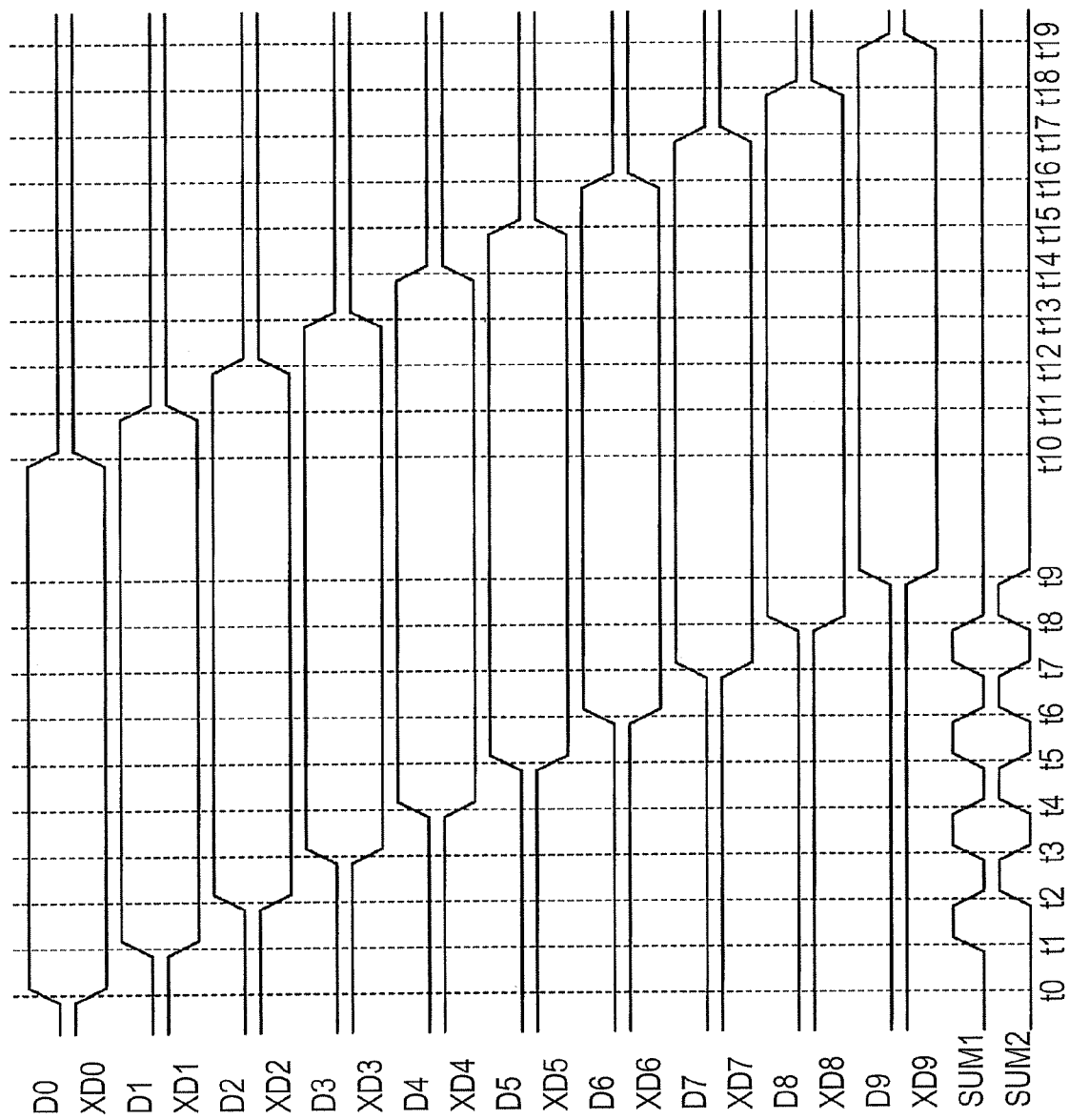
FIG. 12 is a chart for explaining an operation of the control signal generation circuit.

In FIG. 11A, a group of terminals surrounded by an ellipse 833 of a dashed line corresponds to terminals for inputting 16 control signals D1 through D8, and XD2 through XD9, and connected respectively to the gates of the transistors 801 through 832 of the grounded-gate stages along a rule described below. A method of generating the control signals D1 through D8, and XD2 through XD9 will be described later with reference to FIG. 11B. Further, FIG. 12 shows a timing chart for supplementarily explaining the control signals D1 through D8, and XD2 through XD9, and the operations thereof.

In order for explaining the operations of the circuit, it is assumed that the transistors 801 through 832 of the grounded-gate stages are divided into an A group corresponding to the transistors 801 through 808, a B group corresponding to the transistors 809 through 816, a C group corresponding to the transistors 817 through 824, and a D group corresponding to the transistors 825 through 832.

The transistors 801 through 808 of the A group further amplify by the series transistor rows, in a grounded-gate amplifying manner, the signal amplified by the transistor 101 of the input grounded-gate stage, and output it with the inductor 134 to the output terminal 121.

The transistors 809 through 816 of the B group further amplify by the series transistor rows, in a grounded-gate amplifying manner, the signal amplified by the transistor 101 of the input grounded-gate stage, and output it with the inductor 135 to the output terminal 120.

The transistors 817 through 824 of the C group further amplify by the series transistor rows, in a grounded-gate amplifying manner, the signal amplified by the transistor 102 of the input grounded-gate stage, and output it with the inductor 135 to the output terminal 120.

The transistors 825 through 832 of the D group further amplify by the series transistor rows, in a grounded-gate amplifying manner, the signal amplified by the transistor 102 of the input grounded-gate stage, and output it with the inductor 134 to the output terminal 121.

Assuming that the control signals D1 through D8, and XD2 through XD9 take two values of the first voltage level V0 and the second voltage level V1 similarly to the explanations of the first configuration example described above, and assuming the two values as logical values, the transistors 801, 802 operate as the grounded-gate amplifier when the logical product between the control signals D1 and XD2 is true, and are switched off in other conditions. The other transistors 803 through 808 of the A group form three series transistor pairs, each of the pairs operating as the grounded-gate amplifier when the respective one of the logical products between D3 and XD4, D5 and XD6, and D7 and XD8 is true, and being switched off in other conditions. In other words, assuming i as an even number, the transistors of the A group operate as the grounded-gate amplifiers when the logical product between $D_{i-1}$ and $XD_i$ is true, and are switched off in other conditions.

The transistors 817 through 824 of the C group have completely the same connection as the transistors 801 through 808 of the A group, and therefore, operate as the grounded-gate amplifiers when the logical product between $D_{i-1}$ and $XD_i$ is true, and are switched off in other conditions.

The transistors 809 through 816 of the B group and the transistors 825 through 832 of the D group operate as the grounded-gate amplifiers when the logical product between $D_i$ and $XD_{i+1}$ is true, and are switched off in other conditions.

Therefore, when the logical product between $D_{i-1}$ and $XD_i$ is true, the signal on which the input grounded-gate amplification is executed by the transistor 101 is amplified by the transistors 801 through 808 of the A group in a grounded-gate amplifying manner, and then output to the output terminal 121 (the second node N2). Further, on this occasion, the signal on which the input grounded-gate amplification is executed by the transistor 102 is amplified by the transistors 817 through 824 of the C group in a grounded-gate amplifying manner, and then output to the output terminal 120 (the fourth node N4).

When the logical product between $D_i$ and $XD_{i+1}$ is true, the signal on which the input grounded-gate amplification is executed by the transistor 101 is amplified by the transistors 809 through 816 of the B group in a grounded-gate amplifying manner, and then output to the output terminal 120 (the fourth node N4). Further, on this occasion, the signal on which the input grounded-gate amplification is executed by the transistor 102 is amplified by the transistors 825 through 832 of the D group in a grounded-gate amplifying manner, and then output to the output terminal 121 (the second node N2).

In the logical product between $D_{i-1}$ and $XD_i$ and the logical product between $D_i$ and $XD_{i+1}$, by taking the summation (logical summation) with respect to each of the cases of i=2 through 8, SUM1 and SUM2 shown in FIG. 12 can be obtained. When regarding the two signals SUM1, SUM2 as differential signals, the two signals form the template signal used for the UWB-IR.

By appropriately generating the control signals D1 through D8, and XD2 through XD9 and arranging that the signals generated from the logical products between $D_{i-1}$ and $XD_i$ and the logical products between $D_i$ and $XD_{i+1}$ form the template pulses as described above in the explanations of the operation, there can be obtained on the output terminals 120, 121 of the mixer circuit 800 the result of the multiplication between the template pulses and the signals obtained by amplifying the differential signals RF+, RF− applied to the input terminals (the first and second input nodes) 103, 104.

Hereinafter, a method of generating the control signals D1 through D8, and XD2 through XD9 will be explained with reference to the control signal generation circuit shown in FIG. 11B and the timing chart representing the operation shown in FIG. 12.

Delay circuits 841 through 849 are differential delay circuits. The delay circuits 841 through 849 are delay circuits for outputting, in a differential manner, the differential signals with a predetermined delay, and a flip-flop circuit constituted with NOR circuits 301, 302 (or 303, 304) shown in FIG. 3, a differential amplifier composed of the transistors 501 through 505 (or 508 through 512) shown in FIG. 5, and so on can be used therefor. Further, a circuit obtained by coupling the outputs of the inverters, which are limited in current, with a cross-coupled inverter is also used frequently.

Here, when the signals D0, XD0 as the start signals are input to the delay circuit 841, the output signals XD1, D1 are output with a predetermined delay (FIG. 12). After then, the signals are output by the delay circuits 842 through 849 in order with the delay, thus outputting the control signals D2 through D9, and XD2 through XD9. It should be noted that in the mixer circuit 800 of the present configuration example, the signals XD1 and D9 are not used.

In the logical product between $D_{i-1}$ and $XD_i$ and the logical product between $D_i$ and $XD_{i+1}$, by taking the summation (logical summation) with respect to each of the cases of i=2 through 8, SUM1 and SUM2 shown in FIG. 12 can be obtained. When regarding the two waveforms as differential signals, they correspond to the pulses with the number of pulse fingers of 4 used in the UWB-IR, and by controlling the amounts of delay of the delay circuits 841 through 849 to match the cycle of the pulses with the cycle of the pulses used in the UWB-IR, the template waveform to be used for the UWB-IR can be obtained.

In contrast to the fact that the control circuit 305 for counting the number of fingers is required for defining the number of pulse fingers in the first configuration example, such a circuit is not required in the third configuration example because the number of pulse fingers is automatically determined from the number of delay circuits and the number of series transistor rows of the grounded-gate amplifying stages. If the number of pulse fingers becomes large, the number of series transistor rows also becomes large, and concerns about influences of the parasitic elements such as parasitic capacitors arises. However, what are increased in the number thereof are grounded-gate stages, and the input/output impedance of the grounded-gate stage is sufficiently low in general compared to that of the parasitic element, and therefore, the influence thereof does not become significant.

Therefore, by using the third configuration example 800 of the mixer circuit of the present embodiment, it becomes possible to amplify the received signal in a low-noise manner, and to obtain the result of the multiplication with the template signal without generating the UWB-IR template signal. Moreover, since the circuit current can be shut off when no signal reception occurs, the standby power consumption is extremely low. Further, since there is no need for generating the template-pulses, and the template pulses for each term can be generated with a single state transition of the delay circuit train, it is possible to minimize the circuit required to operate at high speed.

Although in the explanations described above the signals corresponding to the logical product between $D_{i-1}$ and $XD_i$ and the logical product between $D_i$ and $XD_{i+1}$ are generated at the rising edge of the start signal D0, and at that moment, the multiplication with the received signal is executed, it is possible to execute the multiplication with the template signal at the falling edge of the start signal D0 by slightly modifying the circuit. Since on this occasion the multiplication becomes possible at both signal transitions, namely the rising edge and the falling edge at which the delay circuit train consumes power, it becomes possible to increase an amount of receivable information per circuit power consumption. In order for achieving the above, the control signals are connected to the gates of the series transistor rows of the grounded-gate amplifying stages so that circuit operates in accordance with the state of the logical product between $D_{i-1}$ and $XD_i$ and the logical product between $D_i$ and $XD_{i+1}$, and further, four transistor groups are formed in addition to the four groups of A, B, C, and D described above and are connected in parallel to each other.

In the third configuration example 800 of the mixer circuit of the present embodiment, in the communication device such as the UWB-IR for performing the low-noise amplification and multiplication between the signal thus amplified and the template signal instead of externally inputting the high-speed template signal, and dealing with an intermittent signal, the switch function capable of the intermittent operation for consuming power only when an effective signal exists is particularly provided in addition thereto. Thus, by using the third configuration example 800 of the mixer circuit of the present embodiment for the UWB-IR communication device, in particular for the receiving device, it is possible to realize substantial reduction in power consumption of the device and simplification of the configuration thereof.

5. First Configuration Example of Communication Device

Figures 13A, 13B:
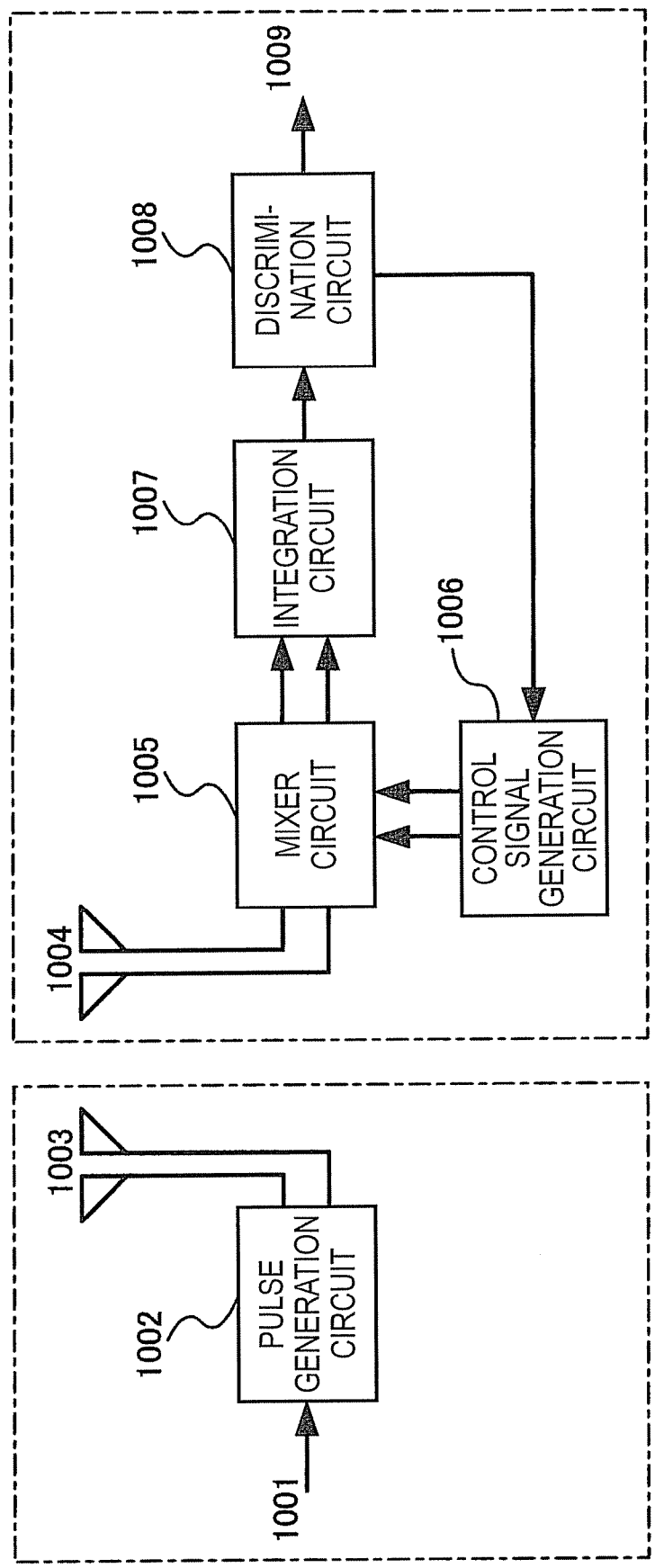
FIGS. 13A and 13B are diagrams showing a first configuration example of a communication device including the mixer circuit.

Then, a communication device including the mixer circuit of the present embodiment will be explained. FIGS. 13A and 13B show a first configuration example of the UWB-IR communication device using the mixer circuit of the present embodiment.

FIG. 13A shows a transmission device. The data to be transmitted is input in a terminal 1001. A pulse generation circuit 1002 generates wide band pulses. On this occasion, the pulse generation circuit 1001 receives the transmission data signal input to the terminal 1001, and then executes predetermined modulation on the pulses to be generated. As the modulation method, pulse position modulation (PPM) for shifting the generation position of the generated pulse, bi-phase modulation (BPM) for reversing the polarity of the generated pulse, and so on are often used. The pulses thus generated and modulated are emitted to space via a transmitting antenna 1003.

Here, the mixer circuit of the present embodiment can be used for the pulse generation circuit 1002. In other words, it is enough to input the information to be transmitted and formed to be a serial signal to the input terminals 103, 104 (FIGS. 1, 9, 10, and 11A) as the baseband signal, as the input signal of the input grounded-gate stage. In this case, when transmitting it with PPM, the timing of the start signal (a signal corresponding to the initialization signal IS shown in FIG. 3, or D0 and XD0 shown in FIG. 12) is controlled for shifting the pulse position. Further, in the case with BPM, the polarity of the signal input to the input terminals 103, 104 in sync with the start signal is changed. In the mixer circuit of the present embodiment, since the value of multiplication between the template pulses (Ga−Gb shown in FIG. 2, or SUM1 and SUM2 shown in FIG. 12) synthesized in the mixer circuit and the baseband signal described above is output in accordance with the logic of the baseband signal and the control signals G1 through G4 (FIGS. 1, 4, 9, and 10) or D1 through D8, and XD2 through XD9 (FIGS. 11 and 12), the modulation of the UWB-IR can simultaneously be performed.

Then, a configuration of the receiving device using the mixer circuit of the present embodiment will be explained with reference to FIG. 13B. The signal received by the antenna 1004 is input to a mixer circuit 1005 of the present embodiment. As the mixer circuit 1005, the mixer circuits 1, 600, 700, and 800 respectively shown in FIGS. 1, 9, 10, and 11A can be used. Since in these mixer circuits 1, 600, 700, and 800 the differential signal can be processed, a balanced antenna can be used as the antenna 1004. By dealing with the differential signal, lowering of the power supply voltage of the circuit and reduction in signal distortion becomes possible. Further, it is possible to design the input impedance of the amplifier to be lower using the input grounded-gate amplifying stage, thus a preferable matching characteristic of the input can be obtained. Since the mixer circuit of the present embodiment has both of the function of low-noise amplification and the function of generating the template signal and multiplying the template signal by the signal thus amplified, these functions can be performed by a single circuit. The control signal generation circuit 1006 is a circuit for generating the control signals to be sent to the mixer circuit 1005, and the circuit shown in FIG. 3, FIG. 5, or FIG. 11B can be used therefor.

The received signal, which is amplified by the mixer circuit 1005, and multiplied by the template pulses, is smoothed by an integration circuit 1007, and bit information transmitted from the result thereof is discriminated by a discrimination circuit 1008, and then output from a terminal 1009 as a demodulated output. In other words, the mixer circuit 1005 and the integration circuit 1007 constitute a correlator, and calculate correlation between the received signal and the template pulses. The discrimination (demodulation) of the signal thus transmitted can be executed from the calculation result of the correlation. The discrimination circuit 1008 also has charge of control of the entire circuit, and sends the start signal to the control signal generation circuit 1006 of the mixer circuit 1005 in sync with the demodulated signal at precise timing when the subsequent signal arrives, thereby generating the control signals provided to the mixer circuit 1005.

Since the mixer circuit of the present embodiment has both of the function of the low-noise amplification and the function of generating the template signal and multiplying the input signal thus amplified by the template signal, the configuration of the circuit is extremely simplified. Further, it is possible to design the input impedance of the amplifier to be lower using the input grounded-gate amplifying stage, thus a preferable matching characteristic of the input can be obtained. Further, the consumption current of the mixer circuit of the present embodiment is reduced to an extremely small current of only the leakage current of the circuit components in the resting state (standby state) in which no start signal is input. Thus, the power consumption of the system can be made extremely small.

In the configuration of the communication device described above, it is possible to use the same mixer circuit in both of the transmission device and the receiving device. Thus, in the case of configuring a transceiver device (electronic equipment) having an integrated transmitter/receiver, further simplification of the configuration becomes possible.

6. Second Configuration Example of Communication Device

Then, a second configuration example of the communication device including the mixer circuit of the present embodiment will be explained. Although in the first configuration example of the communication device described above, the explanations are presented assuming that the control signal input to the mixer circuit has the binary digital values, it is also possible to input an analog signal such as a sine wave.

When inputting the analog signal, in the circuits shown in FIGS. 1, 9, and 10 requiring four control signals, the control signals are divided into two groups, one including G1 and G3, the other including G2 and G4, and differential signals $v_{b1} \pm v_1$, $v_{b2} \pm v_2$ are respectively input thereto. Here, $v_{b1}$ and $v_{b2}$ are in-phase components of the signals of the respective groups, and are bias provided to the signals. As $v_{b1}$ and $v_{b2}$, direct current with constant voltage is generally provided. Further, $v_1$ and $v_2$ are differential components, and the analog control signals.

When applying the signals as described above, assuming that the input signal (the differential component of the signals applied to the input terminals 103, 104) is $v_r$, the output signals appearing on the output terminals include the signal component $v_1 \times v_2 \times v_r$ represented by the product of these three differential components. Therefore, when considering the sine waves with frequencies $f_r$, $f_1$, $f_2$ as the components $v_r$, $v_1$, $v_2$, the output includes the signal with the frequency component of $f_r \pm f_1 \pm f_2$.

If the frequencies are set to satisfy $f_r = f_1 + f_2$ (or $f_1 = f_2 = f_r/2$), $v_r$ can be frequency-converted and directly dropped to the baseband. In this case, since the frequency of the local oscillation circuit is not equal to the frequency of $v_r$, the DC offset becoming a problem for most direct conversion receivers is not caused. Therefore, in the receiver not only for UWB but also for communication using narrow band signals using normal phase modulation, frequency modulation, or amplitude modulation, the configuration thereof can extremely be simplified.

Figure 14:
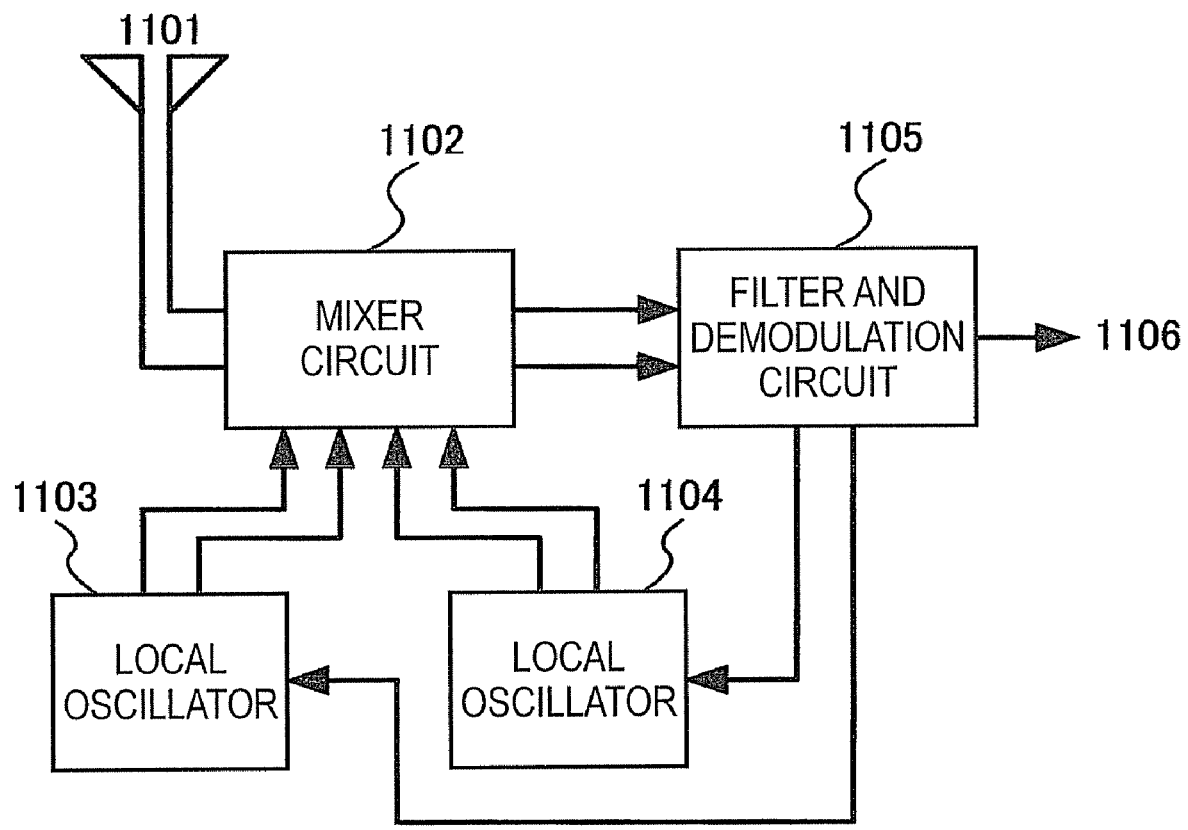
FIG. 14 is a diagram showing a second configuration example of the communication device including the mixer circuit.

FIG. 14 is a block diagram when configuring the receiver according to the principle described above. The received signal received by the antenna 1101 is directly input to the mixer circuit 1102 of the present embodiment described above. Since the mixer circuit of the present embodiment described above has also the function of the low-noise amplification in addition to another function, there is no need for providing the low-noise amplifier on the anterior stage of the mixer circuit. Here, the circuit explained with reference to FIG. 1, FIG. 9 or FIG. 10 can be used.

The local oscillation circuits 1103, 1104 respectively oscillate at first and second frequencies $f_1$, $f_2$. Here, assuming that the frequency of the signal to be received is $f_r$, and setting the frequencies so as to satisfy $f_r = f_1 + f_2$, the received signal is converted into the baseband. The circuit 1105 is composed of a filter and a demodulation circuit for taking out only the baseband component out of the signal converted by the mixer circuit 1102 from a terminal 1106. In accordance with the modulation method (such as phase modulation, frequency modulation, or amplitude modulation) of the received signal, the received signal is demodulated and the information thus received is restored. The local oscillation circuits 1103, 1104 track the received signal using the phase locked loop or the like, and perform control such as always keeping the phase difference between the received signal and the carrier wave constant, thereby making it possible to obtain high receiver performance.

It should be noted that it is possible to arrange that the difference between the first and second frequencies $f_1$, $f_2$ matches with the received signal frequency $f_r$. In other words, the frequencies can be arranged to satisfy $f_r=f_1-f_2$ or $f_r=f_2-f_1$.

According to the configuration described above, the direct conversion receiver can easily be configured. The direct conversion receiver does not have an intermediate frequency amplifying stage, and therefore, has a simple configuration, higher sensitivity compared to the heterodyne system for repeating the conversion many times, and strong resistance to disturbance and distortion caused by a large signal such as cross-modulation. Moreover, although the direct conversion method in the related art has a serious problem of the DC offset, the present mixer circuit does not cause the DC offset. Further, since the present mixer circuit has the function of the low-noise amplification in addition to another function, the circuit can further be simplified. Still further, as explained above, by setting the output potential of the local oscillation circuits 1103, 1104, which are provided to the mixer circuit 1102 as the control voltage, to be a predetermined value, it becomes possible to halt the operation of the mixer circuit thereby minimizing (nearly zero) the circuit current. This is extremely effective for reducing the power consumption of the circuit in the standby state.

Although the case in which the two local oscillation circuits are provided is explained above, it is also possible to input a larger number of signals. Hereinafter, the case of inputting n (n denotes an integer equal to or greater than 2) signals will be explained. The circuit obtained by further adding four transistor groups explained in the third configuration example of the mixer circuit, which operate in accordance with the states of the logical product between $D_{i-1}$ and $XD_i$ and the logical product between $D_i$ and $XD_{i+1}$, to the circuit shown in FIG. 11A corresponds to a circuit example with n=8. Here, signal train $v_i$ (i=1 through n) is provided to $D_i$ and $XD_i$ as differential signals. It should be noted that although the terminal of XD1 is not shown in FIG. 11A, it is assumed that XD9 is used for XD1. Further, although the signal of D9 is required for switch group of the logical product between $D_{i-1}$ and $XD_i$ and the logical product between $D_i$ and $XD_{i+1}$, it is assumed that D1 substitutes for D9. Although the control signals with the order up to n+1 are necessary in general when n series transistor rows are provided to each group, it is assumed that $D_1$, $XD_1$ substitute for $D_{n+1}$, $XD_{n+1}$, respectively. According to the above rule, by providing the signal train $v_i$ between $D_i$ and $XD_i$ as differential signals, the component of the product of the input signal $v_r$ and the signal train, namely the component of $v_r \times v_1 \times v_2 \times \ldots \times v_n$ appears on the output. Thus, it becomes possible to mix four or more frequencies. By making good use of them, it can be applied to simplification of equipment, and to elimination of a specific disturbing frequency. Further, it is possible to design the input impedance of the amplifier to be lower using the input grounded-gate amplifying stage, thus a preferable matching characteristic of the input can be obtained.

As described hereinabove, according to the mixer circuit of the present embodiment, a mixer circuit having all of the function of the low-noise amplifier, the function of generating the template pulses, and the function of minimizing the power consumption in the standby state can be provided. It is possible to configure efficient UWB-IR receiver using the mixer circuit. Further, since the mixer circuit of the present embodiment can provide a mixer circuit, which does not have the DC offset problem even if it is used in the receiver of the narrow band communication method in the related art, it is possible to configure a high performance direct conversion receiver with a simple configuration. Further, by using the UWB-IR receiver (communication device) of the present configuration example, a high performance transceiver device (electronic equipment) or the like with a simple configuration can be realized.

It should be noted that although the present embodiment is hereinabove explained in detail, it should easily be understood by those skilled in the art that various modifications not substantially departing from the novel matters and the effects of the invention are possible. Therefore, such modified examples should be included in the scope of the invention. For example, a term described at least once with a different term with a broader sense or the same meaning in the specification or the accompanying drawings can be replaced with the different term in any part of the specification or the accompanying drawings. Further, the configurations and the operations of the mixer circuit, the communication device, and the electronic equipment are not limited to what is explained in the present embodiment, but can be put into practice in variously modified forms.

The entire disclosure of Japanese Patent Application No. 2009-055231, filed Mar. 9, 2009 is expressly incorporated by reference herein.

What is claimed is:

1. A mixer circuit comprising:
   a grounded-gate amplifier disposed between an input node and a first node; and
   first through nth (n denotes an integer equal to or greater than 1) series transistor rows disposed between the first node and a second node;
   a capacitor disposed between the second node and a second power supply node; and
   a switch element disposed between the second node and the second power supply node, wherein:
   each of the first through nth series transistor rows includes two or more transistors coupled in series between the first node and the second node, and
   the transistors constituting the first through nth series transistor rows are controlled by first through mth (m denotes an integer equal to or greater than 2) control signals.

2. The mixer circuit according to claim 1, wherein
   at least one of the first through mth control signals is a control signal having a first voltage level switching off the transistor constituting the first through nth series transistor rows.

3. The mixer circuit according to claim 2, wherein
   at least one of the first through mth control signals is a control signal having
   the first voltage level switching off the transistor constituting the first through nth series transistor rows, and
   a second voltage level providing a predetermined bias voltage to the transistor constituting the first through nth series transistor rows.

4. The mixer circuit according to claim 3, wherein
   the first through mth control signals are signals with phases different from each other.

5. The mixer circuit according to claim 4, wherein
   a signal amplified by the grounded-gate amplifier is output via any of the first through nth series transistor rows set in an on state by j (j denotes an integer satisfying $2 \leq j \leq m$) control signals out of the first through mth control signals.

6. The mixer circuit according to claim 5, wherein
   the first through mth control signals include a pulse signal with a width larger than a width of a template pulse of an ultra wide band-impulse radio (UWB-IR) signal.

7. The mixer circuit according to claim 6, further comprising:

a load element disposed between a first power supply node and the second node.

8. The mixer circuit according to claim 7, wherein an output signal is output from the second node.

9. The mixer circuit according to claim 7, wherein a current mirror circuit is provided as the load element, and an output signal is output from an output node of the current mirror circuit.

10. The mixer circuit according to claim 1, wherein
a set of series transistor row is provided as the first through nth series transistor rows,
first and second control signals are input as the first through mth control signals,
the set of series transistor row includes a first transistor and a second transistor coupled in series between the first node and the second node, and
the first transistor and the second transistor are respectively controlled by the first control signal and the second control signal.

11. The mixer circuit according to claim 1, wherein
first and second series transistor rows are provided as the first through nth series transistor rows,
first through fourth control signals are input as the first through mth control signals,
the first series transistor row includes a first transistor and a second transistor coupled in series between the first node and the second node,
the second series transistor row includes a third transistor and a fourth transistor coupled in series between the first node and the second node,
the first transistor and the second transistor are respectively controlled by the first control signal and the second control signal, and
the third transistor and the fourth transistor are respectively controlled by the third control signal and the fourth control signal.

12. The mixer circuit according to claim 1, further comprising:
a first input node to which a first input signal constituting a set of differential input signals is input;
a second input node to which a second input signal constituting the set of differential input signals is input;
a first grounded-gate amplifier disposed between the first input node and the first node; and
a second grounded-gate amplifier disposed between the second input node and a third node, wherein:
the first through nth series transistor rows are first through fourth series transistor rows,
the first through mth control signals are first through fourth control signals,
the first series transistor row includes a first transistor and a second transistor coupled in series between the first node and the second node,
the second series transistor row includes a third transistor and a fourth transistor coupled in series between the first node and the second node,
the third series transistor row includes a fifth transistor and a sixth transistor coupled in series between the third node and the second node,
the fourth series transistor row includes a seventh transistor and an eighth transistor coupled in series between the third node and the second node,
the first transistor and the second transistor are respectively controlled by the first control signal and the second control signal,
the third transistor and the fourth transistor are respectively controlled by the third control signal and the fourth control signal,
the fifth transistor and the sixth transistor are respectively controlled by the second control signal and the third control signal, and
the seventh transistor and the eighth transistor are respectively controlled by the first control signal and the fourth control signal.

13. The mixer circuit according to claim 7,
a first input node to which a first input signal constituting a set of differential input signals is input;
a second input node to which a second input signal constituting the set of differential input signals is input;
a first load element disposed between the first power supply node and the second node,
a second load element disposed between the first power supply node and the fourth node;
a first grounded-gate amplifier disposed between the first input node and the first node; and
a second grounded-gate amplifier disposed between the second input node and a third node, wherein:
the first through nth series transistor rows are first through eighth series transistor rows,
the first through mth control signals are first through fourth control signals,
the first series transistor row includes a first transistor and a second transistor coupled in series between the first node and the second node,
the second series transistor row includes a third transistor and a fourth transistor coupled in series between the first node and the second node,
the third series transistor row includes a fifth transistor and a sixth transistor coupled in series between the first node and the fourth node,
the fourth series transistor row includes a seventh transistor and an eighth transistor coupled in series between the first node and the fourth node,
the fifth series transistor row includes a ninth transistor and a tenth transistor coupled in series between the third node and the fourth node,
the sixth series transistor row includes an eleventh transistor and a twelfth transistor coupled in series between the third node and the fourth node,
the seventh series transistor row includes a thirteenth transistor and a fourteenth transistor coupled in series between the third node and the second node,
the eighth series transistor row includes a fifteenth transistor and a sixteenth transistor coupled in series between the third node and the second node,
the first transistor and the second transistor are respectively controlled by the first control signal and the second control signal,
the third transistor and the fourth transistor are respectively controlled by the third control signal and the fourth control signal,
the fifth transistor and the sixth transistor are respectively controlled by the second control signal and the third control signal,
the seventh transistor and the eighth transistor are respectively controlled by the first control signal and the fourth control signal,
the ninth transistor and the tenth transistor are respectively controlled by the first control signal and the second control signal, the eleventh transistor and the twelfth transistor are respectively controlled by the third control signal and the fourth control signal, the thirteenth transistor and the fourteenth transistor are respectively controlled by the second control signal and the third control signal, the fifteenth transistor and the sixteenth transistor are respectively controlled by the first control signal and the fourth control signal, a first differential output signal corresponding to the first input signal is output from the fourth node, and a second differential output signal corresponding to the second input signal is output from the second node.

14. A communication device, comprising:

the mixer circuit according to claim 1; and a control signal generation circuit adapted to generate the first through mth control signals.

15. Electronic equipment comprising the communication device according to claim 14.

* * * * *